(12) United States Patent
Ke

(10) Patent No.: US 12,183,234 B2
(45) Date of Patent: Dec. 31, 2024

(54) DISPLAY PANEL AND DISPLAY DEVICE

(71) Applicant: Xiamen Tianma Display Technology Co., Ltd., Xiamen (CN)

(72) Inventor: Zhoulin Ke, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 115 days.

(21) Appl. No.: 17/853,539

(22) Filed: Jun. 29, 2022

(65) Prior Publication Data

US 2023/0215314 A1 Jul. 6, 2023

(30) Foreign Application Priority Data

Dec. 31, 2021 (CN) .......................... 202111669542.4

(51) Int. Cl.
*G09G 3/20* (2006.01)
*H10K 59/131* (2023.01)

(52) U.S. Cl.
CPC ............ *G09G 3/20* (2013.01); *H10K 59/131* (2023.02); *G09G 2300/0819* (2013.01); *G09G 2310/0297* (2013.01); *G09G 2310/061* (2013.01); *G09G 2320/0233* (2013.01); *G09G 2320/0247* (2013.01)

(58) Field of Classification Search
CPC ............... G06V 40/50; G06V 40/1359; G06V 40/1365; G06V 40/1371; G06V 40/1376
See application file for complete search history.

(56) References Cited

U.S. PATENT DOCUMENTS

| 2021/0391407 | A1* | 12/2021 | Yoon | ..................... G06F 3/0412 |
| 2022/0246688 | A1* | 8/2022 | Park | ..................... H10K 59/131 |
| 2022/0310736 | A1* | 9/2022 | Seo | ..................... H10K 59/1216 |
| 2022/0328603 | A1* | 10/2022 | Shi | ..................... H10K 59/1216 |
| 2023/0263020 | A1* | 8/2023 | Yu | ......................... G09G 3/3233 |

* cited by examiner

*Primary Examiner* — Yuzhen Shen
(74) *Attorney, Agent, or Firm* — Anova Law Group, PLLC

(57) ABSTRACT

A display panel and a display device are provided. The display panel includes a first display area and a second display area; and the second display area includes a transmission area. The sum of the resistivities of a first reset signal line, a first initialization signal line and a first bias adjustment signal line located in the first display area may not be greater than the sum of the resistivities of the second reset signal line, the second initialization signal line and the second bias adjustment signal line located in the second display area such that at least one of the first reset signal line, the first initialization signal line and the first these signal lines with relatively high resistivity requirements is disposed arranged on the film layer with a low signal lines resistivity of the signal line.

19 Claims, 16 Drawing Sheets

DISPLAY PANEL AND DISPLAY DEVICE

CROSS-REFERENCE TO RELATED APPLICATION

This application claims the priority of Chinese Patent Application No. 202111669542.4, filed on Dec. 31, 2021, the content of which is incorporated by reference in its entirety.

TECHNICAL FIELD

The present disclosure generally relates to the field of display technologies and, more particularly, relates to a display panel and a display device.

BACKGROUND

With the rapid development of display technology, in addition to the conventional functions of information display, the requirements for the appearance of the display are also gradually increasing; and a larger screen ratio is the trend of the future display market. Therefore, the display device with the under-screen camera structure has attracted much more attentions.

At present, in the display device with the under-screen camera structure, a transmission area is usually displayed in the display area of the display panel such that the light passes through the display area of the display panel and irradiates to the camera located below the display panel, and the camera captures the picture. For the display device with an under-screen camera structure, how to balance the display performance and the light transmission performance of the display panel in the display device has gradually become a research focus of those skilled in the art. The present disclosed display panels and display devices are direct to solve one or more problems in the art.

SUMMARY

One aspect of the present disclosure provides a display panel. The display panel includes a pixel circuit and a light-emitting element. The pixel circuit includes a driving transistor, and the driving transistor is configured to provide a driving current for the light-emitting element. The display panel also includes a reset signal line, an initialization signal line and a bias adjustment signal line. The reset signal line is configured to provide a reset signal to a gate of the driving transistor, the initialization signal line is configured to provide an initialization signal to the light-emitting element, and the bias adjustment signal line is configured to provide a bias adjustment signal for the driving transistor. The display panel also incudes a first display area and a second display area. The second display area includes a transmission area, and the first display area includes a first reset signal line, a first initialization signal line and a first bias adjustment signal line, and the second display area includes a second reset signal line, a second initialization signal line and a second bias adjustment signal line. A resistivity of the first reset signal line is $\rho 11$, a resistivity of the first initialization signal line is $\rho 12$, a resistivity of the first bias adjustment signal line is $\rho 13$, a resistivity of the second reset signal line is $\rho 21$, a resistivity of the second initialization signal line is $\rho 22$, and a resistivity of the first bias adjustment signal line is $\rho 23$; and $\rho 11 + \rho 12 + \rho 13 \leq \rho 21 + \rho 22 + \rho 23$.

Another aspect of the present disclosure provides a display device. The display device includes a display panel. The display panel includes a pixel circuit and a light-emitting element. The pixel circuit includes a driving transistor, and the driving transistor is configured to provide a driving current for the light-emitting element. The display panel also includes a reset signal line, an initialization signal line and a bias adjustment signal line. The reset signal line is configured to provide a reset signal to a gate of the driving transistor, the initialization signal line is configured to provide an initialization signal to the light-emitting element, and the bias adjustment signal line is configured to provide a bias adjustment signal for the driving transistor. The display panel also includes a first display area and a second display area. The second display area includes a transmission area, and the first display area includes a first reset signal line, a first initialization signal line and a first bias adjustment signal line, and the second display area includes a second reset signal line, a second initialization signal line and a second bias adjustment signal line. A resistivity of the first reset signal line is $\rho 11$, a resistivity of the first initialization signal line is $\rho 12$, a resistivity of the first bias adjustment signal line is $\rho 13$, a resistivity of the second reset signal line is $\rho 21$, a resistivity of the second initialization signal line is $\rho 22$, and a resistivity of the first bias adjustment signal line is $\rho 23$; and $\rho 11 + \rho 12 + \rho 13 \leq \rho 21 + \rho 22 + \rho 23$. A functional device is correspondingly disposed on the transmission area; and the functional device receives or reflects light through the transmission area.

Other aspects of the present disclosure can be understood by those skilled in the art in light of the description, the claims, and the drawings of the present disclosure.

BRIEF DESCRIPTION OF THE DRAWINGS

The drawings incorporated in the specification and constituting a part of the specification illustrate the embodiments of the present disclosure, and together with the description are used to explain the principle of the present disclosure.

DETAILED DESCRIPTION

The technical solutions in the embodiments of the present disclosure will be clearly and completely described below with reference to the drawings in the embodiments of the present disclosure. Obviously, the described embodiments are only a part of the embodiments of the present disclosure, but not all of the embodiments. Based on the embodiments in this disclosure, all other embodiments obtained by those of ordinary skill in the art without creative efforts shall fall within the protection scope of this disclosure.

Many specific details are set forth in the following description to facilitate a full understanding of the present disclosure, but the present disclosure can also be implemented in other ways different from those described herein, and those skilled in the art can do so without departing from the connotation of the present disclosure. Thus, the present disclosure is not limited by the specific embodiments disclosed below.

The present disclosure provides a display panel and a display device which may balance the display performance and the light transmission performance of the display panel in the display device.

Figure 1:
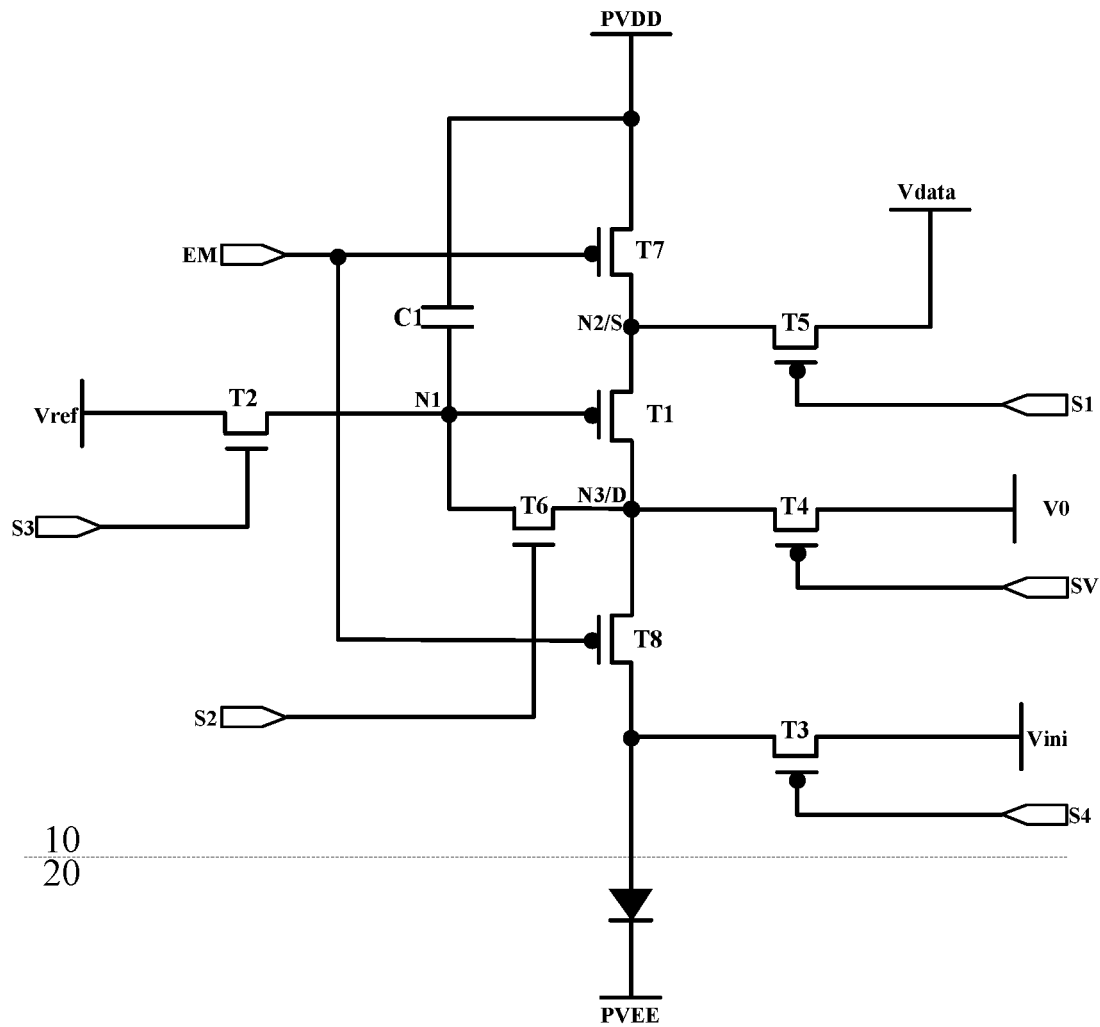
FIG. 1 illustrates a pixel circuit of an exemplary display panel according to various disclosed embodiments of the present disclosure.

FIG. 1 illustrates a pixel circuit of an exemplary display panel according to various disclosed embodiment of the present disclosure. As shown in FIG. 1, the display panel may include a pixel circuit 10 and a light-emitting element 20. The pixel circuit 10 may include a driving transistor T1. The driving transistor T1 may be configured to provide a driving current for the light-emitting element 20 to control the light-emitting state of the light-emitting element 20 through the driving current.

The display panel may also include a reset signal line, an initialization signal line and a bias adjustment signal line. The reset signal line may be configured to provide a reset signal Vref for the gate of the driving transistor T1. The initialization signal line may be configured to provide an initialization signal Vini for the light-emitting element 20. The bias adjustment signal line may be configured to provide a bias adjustment signal V0 for the driving transistor T1.

Figure 2:
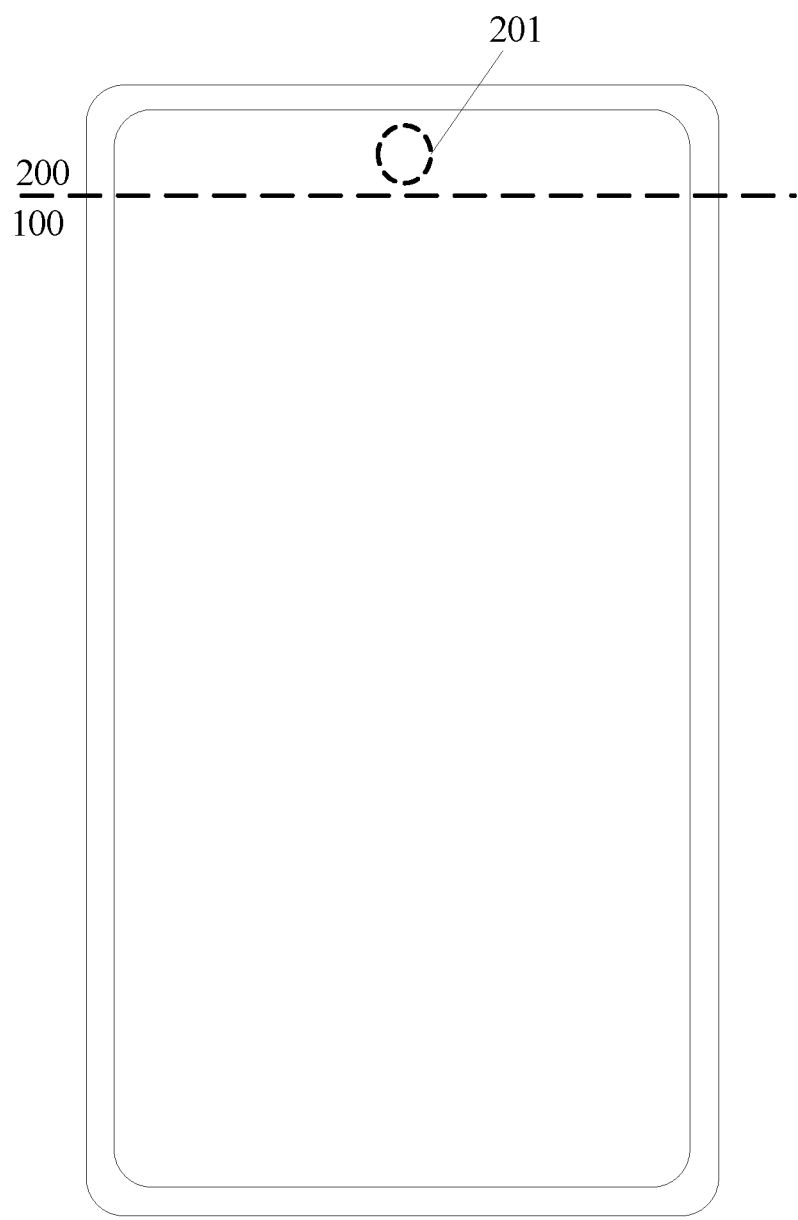
FIG. 2 illustrates a top view of an exemplary display panel according to various disclosed embodiments of the present disclosure.

FIG. 2 illustrates a top view of an exemplary display panel according to various disclosed embodiments of the present disclosure. As shown in FIG. 2, the display panel may include a first display area 100 and a second display area 200. The second display area 200 may include a transmission area 201. It should be noted that, in practical applications, the first display area 100 and the second display area 200 may all include a plurality of sub-pixels. Each sub-pixel may include a pixel circuit and a light-emitting element to realize the display of the sub-pixel.

Figure 3:
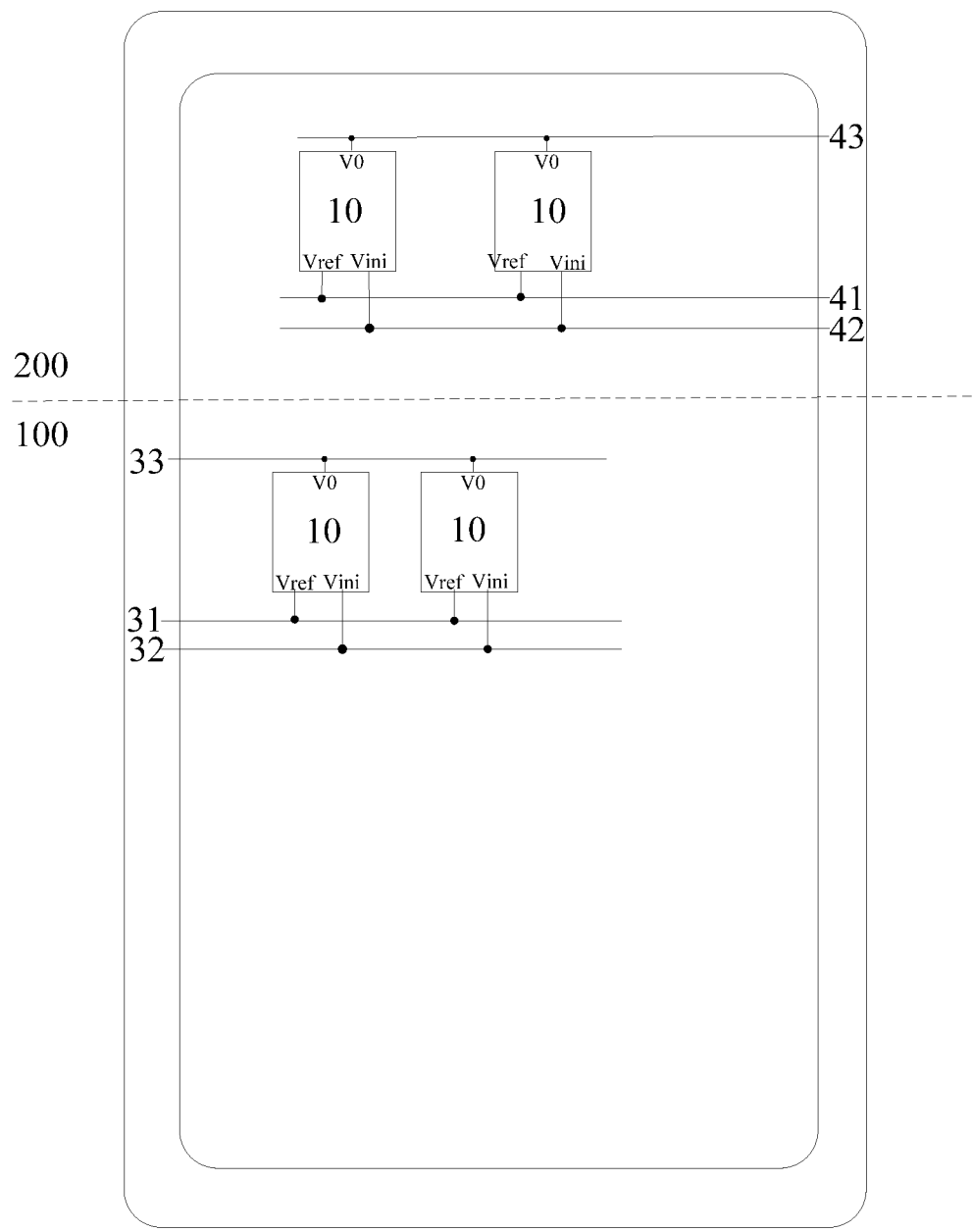
FIG. 3 illustrates a top view of another exemplary display panel according to various disclosed embodiments of the present disclosure.

FIG. 3 illustrates a top view of another exemplary display panel according to various disclosed embodiments of the present disclosure. As shown in FIG. 3, in one embodiment, the first display area 100 may include a first reset signal line 31, a first initialization signal line 32 and a first bias adjustment signal line 33, and the second display area 200 may include a second reset signal line 41, a second initialization signal line 42 and a second bias adjustment signal line 43. The first reset signal line 31 may be configured to provide a reset signal Vref for the pixel circuit 20 located in the first display area 100. The first initialization signal line 32 may be configured to provide an initialization signal Vini to the pixel circuit 20 located in the first display area 100. The first bias adjustment signal line 33 may be configured to provide a bias adjustment signal V0 for the first pixel circuit 20 in the display area 100. The second reset signal line 41 may be configured to provide the reset signal Vref to the pixel circuit 20 located in the second display area 200. The second initialization signal line 42 may be configured to provide the initialization signal Vini to the pixel circuit 20 located in the second display area 200. The second bias adjustment signal line 43 may be configured to provide a bias adjustment signal V0 to the pixel circuit 20 located in the second display area 200. In one embodiment, the first reset signal line, the first initialization signal line, the first bias adjustment signal line, the second reset signal line, the second initialization signal line, and the second bias adjustment signal line may extend in a same direction.

In one embodiment of the present disclosure, the resistivity of the first reset signal line may be $\rho 11$, the resistivity of the first initialization signal line may be $\rho 12$, the resistivity of the first bias adjustment signal line may be $\rho 13$, the resistivity of the second reset signal line may be $\rho 21$, the resistivity of the second initialization signal line may be $\rho22$, and the resistivity of the first bias adjustment signal line may be $\rho23$.

In the practical applications, the resistivities of the three signal lines: the reset signal line, the initialization signal line and the bias adjustment signal line, which are electrically connected to the pixel circuit, may have a certain influence on the performance of the transistors that are electrically connected to them. For example, the smaller the resistivity of the signal line is, the faster the transistor electrically connected to it switches from one state to another state. On the contrary, the greater the resistivity of the signal line is, the slower the transistor electrically connected to it switches from one state to another state. That is, the resistivities of the reset signal line, the initialization signal line and the bias adjustment signal line electrically connected to the pixel circuit may directly affect the state transition and switching performance of the transistors electrically connected to the signal lines. Accordingly, the display performance of the sub-pixel where the pixel circuit is located may be affected.

It should be noted that the first display area may be a normal display area and may not require too much light transmittance. Therefore, the dispositions of the first reset signal line, the first initialization signal line and the first bias adjustment signal line may not need to consider the space occupancy too much, and may mainly be disposed based on their resistance requirements. While the second display area may include a transmission area, and the transmission area has certain requirements for the light transmittance. Therefore, the dispositions of the second reset signal line, the second initialization signal line and the second bias adjustment signal line may need to fully consider the spaces occupied by them. The smaller the spaces occupied by the second reset signal line, the second initialization signal line and the second bias adjustment signal line are, the larger the available areas of the transmission areas in the second display area are. On the contrary, the larger the spaces occupied by the second reset signal line, the second initialization signal line and the second bias adjustment signal line are, the smaller the available areas of the transmission areas in the second display area are. Accordingly, the dispositions of the second reset signal line, the second initialization signal line and the second bias adjustment signal line may not only need to consider their resistance requirements, but also fully consider the space they occupy.

Therefore, in one embodiment of the present disclosure, $\rho11+\rho12+\rho13 \leq \rho21+\rho22+\rho23$. For example, the sum of the resistivities of the first reset signal line, the first initialization signal line and the first bias adjustment signal line located in the first display area may not be greater than the sum of the resistivities of the second reset signal line, the second initialization signal line and the second bias adjustment signal line located in the second display area. Accordingly, at least one of the first reset signal line, the first the initialization signal line and the first bias adjustment signal line may be disposed on the layer with a smaller resistivity. For example, there may be more lines on the layer with the smaller resistivity to reduce the resistances of the signal lines, improve the state switching speed of the transistors electrically connected to the signal lines, thereby improving the display performance of the sub-pixel, and improving the display performance of the first display area. Further, at least one of the second reset signal line, the second initialization signal line and the second bias adjustment signals line may be disposed in the layer with a higher resistivity. If the second reset signal line, the second initialization signal line and the second bias adjustment signal line are disposed on the layer where the first reset signal line, the first initialization signal line and the first bias adjustment signal line are located, the number of signal lines on the layer where the first reset signal line, the first initialization signal line and the first bias adjustment signal line are located may be too much.

It should be noted that, if the second reset signal line, the second initialization signal line and the second bias adjustment signal line are also disposed on the layer where the first reset signal line, the first initialization signal line and the first bias adjustment signal line are located, there may be the following problems: there may be too many signal lines on the layer where the first reset signal line, the first initialization signal line and the first bias adjustment signal line are located. If a sufficiently safe insulation distance between the adjacent signal lines on the layer where the first reset signal line, the first initialization signal line and the first bias adjustment signal line are located are desired, it may be necessary to increase distances between the signal lines on the layer where the first reset signal line, the first initialization signal line and the first bias adjustment signal line are located. Thus, the spaces occupied by the signal lines on the layer where the first reset signal line, the first initialization signal line and the first bias adjustment signal line are located may be too large, which may affect the area of the transmission area and the transmission properties of the second display area. To ensure the transmission area of the second display area, it may be necessary to reduce the distance between adjacent signal lines on the layer where the first reset signal line, the first initialization signal line and the first bias adjustment signal line are located. Such a reduction may cause a short circuit between the adjacent signal lines on the layer where the first reset signal line, the first initialization signal line and the first bias adjustment signal line are located.

In the display panel provided by one embodiment of the present disclosure, the second display area may be provided with a transparent area to realize a light transmission function. Comparing with the first display area, the display performance of the second display area may need to consider the transparency. Therefore, in the display panel provided by the embodiment of the present disclosure, at least one of the second reset signal line, the second initialization signal line, and the second bias adjustment signal line may be disposed on the wiring layer with a higher resistivity to reduce the number of signal lines on the layer where the first reset signal line, the first initialization signal line and the first bias adjustment signal line are located. Accordingly, on the basis to ensure that the signal lines on the layer where the first reset signal line, the first initialization signal line and the first bias adjustment signal line are located may have good electrical properties, the adjacent signal lines on the layer where the first reset signal line, the first initialization signal line, the first bias adjustment signal line are located may have relative large distances to ensure that the adjacent signal lines on the layer where the first reset signal line, the first initialization signal line and the first bias adjustment signal line are located may be insulated from each other, and the probability of short circuit between adjacent signal lines on the layer where the first reset signal line, the first initialization signal line and the first bias adjust signal lines are located may be reduced. Accordingly, the display performance of the first display area may be enhanced. Further, the layer where the first reset signal line, the first initialization signal line and the first bias adjustment signal line are located may have a larger area corresponding to the transmission area of the second display area. Thus, the light transmission performance of the second display area may be improved.

It should be noted that, in the display panel provided by the embodiment of the present disclosure, the signal lines located in the same layer may be made of a same material and may have a same resistivity, and the signal lines located in different layers may be made of different materials, and may be with different resistivities. In other embodiments of the present disclosure, for the signal lines located in different film layers, some of them may be made of a same material and may have the same resistivity, and others may be made of different materials and may have different resistivities. The materials of the signal line may be selected according to the practical situations.

The following describes the display panel provided by the embodiments of the present disclosure by taking the example that the signal lines located in the same layer are made of the same material and have the same resistivity.

It should be noted that in the embodiments of the present disclosure, the specific resistivities of the first reset signal line, the first initialization signal line, the first bias adjustment signal line, the second reset signal line, the second initialization signal line and the second bias adjustment signal line may not be required, as long as the resistivity of the layer where at least one of the first reset signal line, the first initialization signal line and the first bias adjustment signal line is located may be smaller than the resistivity of at least one of the second reset signal line, the second initialization signal line, and the second bias adjustment signal line such that $\rho11+\rho12+\rho13 \leq \rho21+\rho22+\rho23$.

It should also be noted that, in this embodiment of the present application, the first reset signal line, the first initialization signal line, and the first bias adjustment signal line may be in the same layer, or may be in different layers. Similarly, the second reset signal line, the second initialization signal line and the second bias adjustment signal line may also be in the same layer or in different layers, as long as at least one of the first reset signal line, the first initialization signal line and the first bias adjustment signal line is disposed on the layer with a smaller signal line resistivity, and at least one of the second reset signal line, the second initialization signal line and the second bias adjustment signal line may be disposed on the layer with a higher signal line resistivity.

To sum up, in the display panel provided by the embodiment of the present disclosure, $\rho11+\rho12+\rho13 \leq \rho21+\rho22+\rho23$, such that at least one of the first reset signal line, the first initialization signal line and the first bias signal line that may have relatively high resistivity requirements in the first display area may be disposed on the layer with a low signal line resistivity to improve the display performance of the first display area. Further, at least one of the second reset signal line, the second initialization signal line, and the second bias adjustment signal line that may have relatively low resistivity requirements in the second display area may be disposed on the layer with the higher signal line resistivity. Accordingly, the number of signal lines on the layer with the smaller signal line resistivity may be reduced; and the area of the transmission area of the second display area may be increased to ensure the light transmission performance of the second display area. Thus, the display performance and the light transmission of the display panel may be both considered.

Based on the above embodiment, as shown in FIG. 1, in one embodiment of the present disclosure, the pixel circuit 20 may include a reset transistor T2, an initialization transistor T3 and a bias adjustment transistor T4. The reset transistor T2 may be connected to between the reset signal line and the gate of the driving transistor T1. The initialization transistor T3 may be connected between the initialization signal line and the light-emitting element 20. The bias adjustment transistor T4 may be connected between the bias adjustment signal line and the first terminal S or the second terminal D of the driving transistor T1. The reset transistor T2 may be configured to reset the gate of the driving transistor T1 (i.e., the first node N1). The initialization transistor T3 may be configured to reset the anode of the light-emitting element 20. The bias adjustment transistor T4 may be configured to adjust the potential difference between the first terminal S or the second terminal D and the gate of the driving transistor T1.

Figure 4:
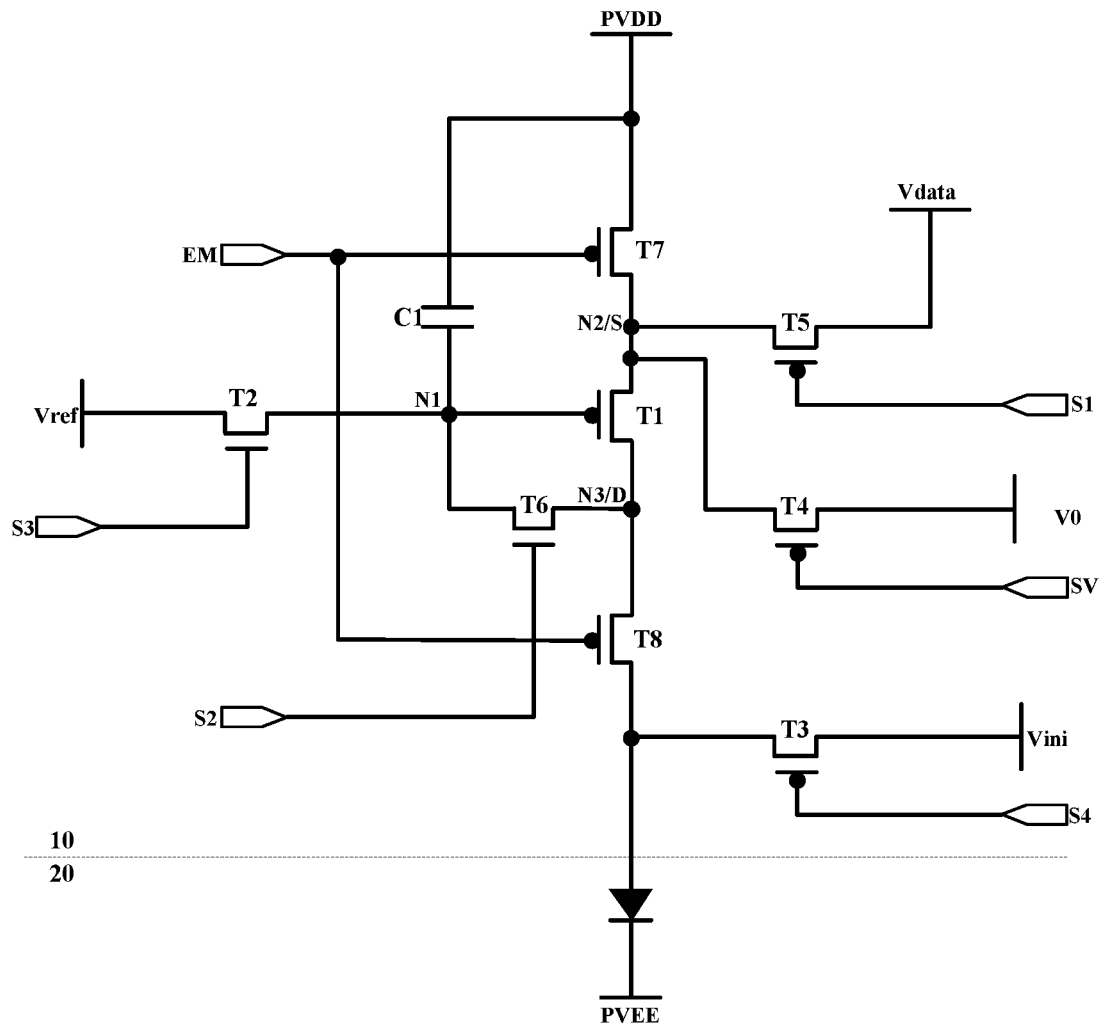
FIG. 4 illustrates a pixel circuit of another exemplary display panel according to various disclosed embodiments of the present disclosure.
Figure 5:
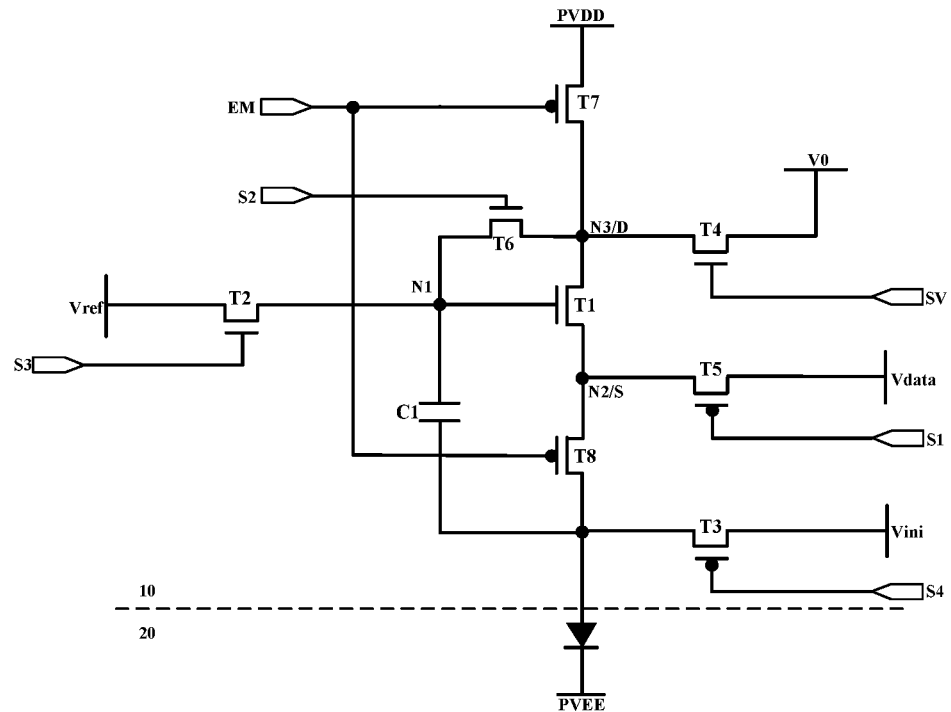
FIG. 5 illustrates a pixel circuit of another exemplary display panel according to various disclosed embodiments of the present disclosure.
Figure 6:
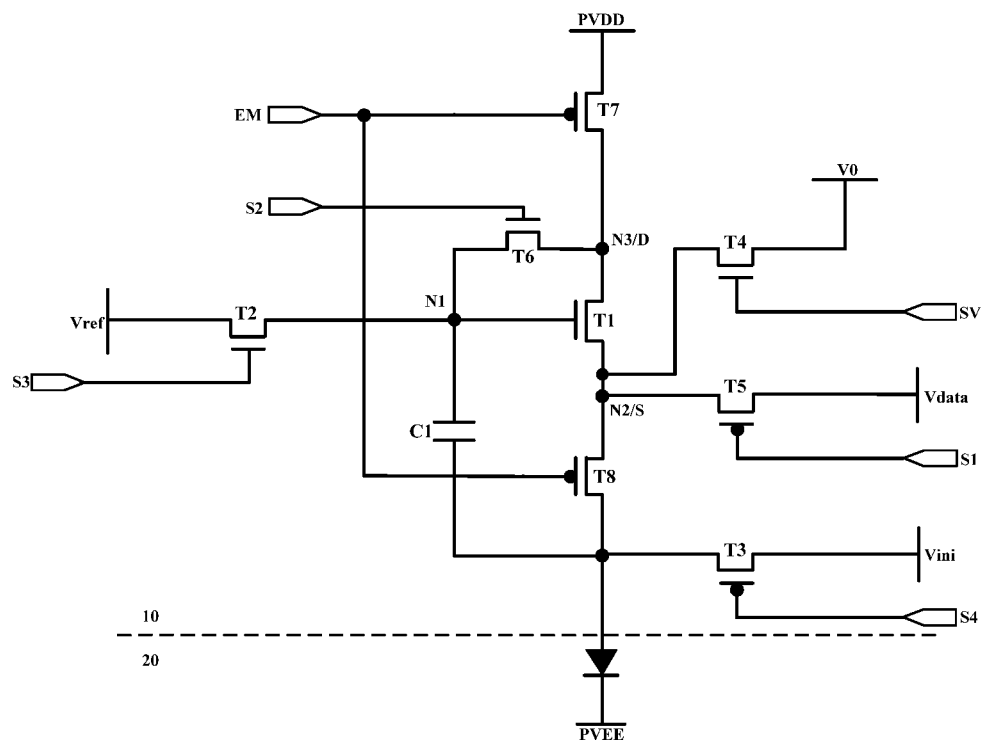
FIG. 6 illustrates a pixel circuit of another exemplary display panel according to various disclosed embodiments of the present disclosure.

FIG. 1 is a schematic structural diagram of a pixel circuit of an exemplary display panel according to various disclosed embodiments of the present disclosure. FIG. 4 is a schematic diagram of the pixel circuit of another exemplary display panel according to various disclosed embodiments of the present disclosure. FIG. 5 is a schematic diagram of the pixel circuit of another exemplary display panel according to various disclosed embodiments of the present disclosure. FIG. 6 is a schematic diagram of the pixel circuit of another exemplary display panel according to various disclosed embodiments of the present disclosure.

As shown in FIG. 1 and FIGS. 4-6, in some embodiments, in addition to a driving transistor T1, a reset transistor T2, an initialization transistor T3, and a bias adjustment transistor T4, the pixel circuit 10 may also include a data writing transistor T5, a compensation transistor T6, a first light-emitting control transistor T7 and a second light-emitting control transistor T8. The data writing transistor T5 may be connected between the data signal line and the first terminal S of the driving transistor T1 to provide the data signal Vdata for the driving transistor T1. The compensation transistor T6 may be connected between the second terminal D of the driving transistor T1 and the gate of the driving transistor T1 to write the data signal Vdata into the gate of the driving transistor T1 to compensate the threshold voltage of the driving transistor T1. The first light-emitting control transistor T7 may be connected between the power signal line and the first terminal S or the second terminal D of the driving transistor T1. The second light-emitting control transistor T8 may be connected between the second terminal D or the first terminal S of the driving transistor T1 and the light-emitting element 20 to supply a driving current to the light-emitting element 20 when the driving transistor T1 is turned on.

The display panel provided by the embodiments of the present disclosure will be described below with reference to specific circuits. It should be noted that the operation process of the pixel circuit may include a pre-stage and a light-emitting stage. The pre-stage may include a reset stage, an initialization stage, a bias adjustment stage, and a threshold compensation stage.

Referring to FIGS. 1-4, in the embodiment of the present disclosure, in the threshold compensation stage, after the driving transistor T1 is turned on, it may be used to write the data signal Vdata into the compensation transistor, and in the light-emitting stage, after the driving transistor T1 is turned on, it may be used to provide a driving current for the light-emitting element 20.

One terminal of the reset transistor T2 may be connected to the reset signal line for receiving the reset signal Vref, and the other terminal of the reset transistor T2 may be connected to the gate of the driving transistor T1. In the reset stage, the reset transistor T2 may be turned on for a conduction to provide a reset signal Vref to the gate of the driving transistor T1. In one embodiment, the reset transistor T2 may directly provide the reset signal Vref to the gate of the driving transistor T1. For example, the gate of the reset transistor T2 may receive the scan signal S3. The scan signal S3 received by the pixel circuit 10 may be a pulse signal. The valid pulse of the scan signal S3 may control the transmission path between the first terminal and the second terminal of the reset transistor T2 to turn on the reset transistor T2 for a conduction to write the reset signal Vref into the gate of the drive transistor T1. The invalid pulse of the scan signal S3 may control the transmission path of the first terminal and the second terminal of the reset transistor T2 to turn off the reset transistor T2. For example, under the control of the scan signal S3, the reset signal Vref of the reset transistor T2 may be selectively written to the gate of the drive transistor T1. It should be noted that, in the reset stage, the scan signal S3 may a valid pulse.

One terminal of the initialization transistor T3 may be connected to the initialization signal line for receiving the initialization signal Vini, and the other terminal of the initialization transistor T3 may connected to the anode of the light-emitting element 20. In the initialization stage, the initialization transistor T3 may be turned on for a conduction to provide the initialization signal Vini for the anode of the light-emitting element 20. For example, the gate of the initialization transistor T3 may receive the scan signal S4. The scan signal S4 received by the pixel circuit 10 may be a pulse signal. The valid pulse of the scan signal S4 may control the transmission path between the first terminal and the second terminal of the initialization transistor T3 to turn on the initialization transistor for a conduction to initialize the anode of the light-emitting element 20 by writing the initialization signal Vini to the anode of the light-emitting element 20. The invalid pulse of the scan signal S4 may control the transmission path of the first terminal and the second terminal of the initialization transistor T3 to turn off the initialization transistor T3 for a disconnection. For example, under the control of the scan signal S4, the initialization transistor T3 may selectively initialize the anode of the light-emitting element 20. It should be noted that, in the initialization stage, the scanning signal S4 may be a valid pulse.

The bias adjusting transistor T4 may be connected between the first terminal S or the second terminal D of the driving transistor T1 and the bias adjusting signal line. The bias adjusting signal line may provide the bias adjusting signal V0. In the bias adjusting stage, the bias adjusting transistor T4 may be turned on to provide the bias adjustment signal V0 to the first terminal S or the second terminal D of the driving transistor T1. For example, the gate of the bias adjusting transistor T4 may receive the scanning signal SV. The scanning signal SV received by the pixel circuit 10 may be a pulse signal. The valid pulse of the scanning signal SV may control the transmission path between the first terminal and the second terminal of the bias adjustment transistor T4 to turn on the bias adjustment transistor T4 to provide the bias adjustment signal V0 to the first terminal S of the driving transistor T1 or the second terminal D of the driving transistor T1. The invalid pulse of the scan signal SV may turn off the transmission path between the first terminal and the second terminal of the bias adjustment transistor T4. For example, under the control of the scanning signal SV, the bias adjustment transistor T4 may selectively provide the bias adjusting signal V0 to the first terminal S or the second terminal D of the driving transistor T1. It should be noted that, in the bias adjustment stage, the bias adjustment signal V0 may be a valid pulse.

One terminal of the data writing transistor T5 may be connected to the data writing signal line, and the other terminal may be connected to the first terminal S of the driving transistor T1. In the compensation stage, the data writing transistor T5 may be turned on to write the data signal Vdata into the first terminal S of the driving transistor T1. For example, the gate of the data writing transistor T5 may receive the scanning signal S1. The scanning signal S1 received by the pixel circuit 10 may be a pulse signal. The valid pulse of the scanning signal S1 may control the transmission path of the first terminal and the second terminal of the data writing transistor T5 to turn on the data writing transistor T5 to provide the data signal Vdata to the first terminal S of the driving transistor T1. The invalid pulse of the scan signal S1 may control the transmission path of the first terminal and the second terminal of the data writing transistor T5 to turn off the data writing transistor T5. For example, under the control of the scanning signal S1, the data writing transistor T5 may selectively provide the data signal Vdata to the first terminal of the driving transistor T1. It should be noted that, in the threshold compensation stage, the scanning signal S1 may be a valid pulse.

One terminal of the compensation transistor T6 may be connected to the gate of the driving transistor T1 (i.e., the first node N1), and the other terminal may be connected to the second terminal D of the driving transistor T1 (i.e., the third node N3). In the compensation stage, the compensation transistor T6 may be turned on for a conduction to write the data signal Vdata transmitted to the second terminal S of the driving transistor T1 to the gate of the driving transistor T1. For example, the gate of the compensation transistor T6 may receive the scan signal S2. The scan signal S2 received by the pixel circuit 10 may be a pulse signal. The valid pulse of the scan signal S2 may control the transmission path of the first terminal and the second terminal of the compensation transistor T6 to turn on the compensation transistor T6 for a conduction to write the data signal Vdata into the gate of the driving transistor T1 to adjust the voltage between the gate of the driving transistor T1 and its second terminal D, and compensate the threshold voltage of the driving transistor T1. The invalid pulse of the scan signal S2 may control the transmission path of the first terminal and the second terminal of the compensation transistor T6 to turned off the compensation transistor T6. For example, under the control of the scan signal S2, the compensation transistor T6 may selectively compensate the threshold voltage of the driving transistor T1. It should be noted that, in the threshold compensation stage, the scanning signal S2 may be a valid pulse.

One terminal of the first light-emitting control transistor T7 may be connected to the power signal line, and the other terminal may be connected to one terminal of the driving transistor T1. One terminal of the second light-emitting control transistor T8 may be connected to the other terminal of the driving transistor T1, and the other terminal may be connected to the anode of the light-emitting element 20. In the light-emitting stage, the power signal PVDD may be transmitted to the light-emitting element 20 to provide a driving current for the light-emitting element 20. For example, the gate of the first light-emitting control transistor T7 may receive the light-emitting control signal EM. The light-emitting control signal EM received by the pixel circuit may be a pulse signal. The valid pulse of the light-emitting control signal EM may control the transmission path between the first terminal and the second terminal of the first light-emitting control transistor T7 to turn on the first light-emitting control transistor T7 and control the transmission path of the first terminal and the second terminal of the second light-emitting control transistor T8 to turn on the second light-emitting control transistor T8 such that, when the driving transistor T1 is turned on, the power signal PVDD may be transmitted to the light-emitting element 20. The invalid pulse of the light-emitting control signal EM may control the transmission path between the first terminal and the second terminal of the first light-emitting control transistor T7 to turn off the first light-emitting control transistor T7 and control the transmission path of the first terminal and the second terminal of the second light-emitting control transistor T8 to turn of the second light-emitting control transistor T8. For example, under the control of the light-emitting control signal EM, the first light-emitting control transistor T7 and the second light-emitting control transistor T8 may selectively provide the driving current for the light-emitting element 20. It should be noted that, in the light-emitting stage, the light-emitting control signal EM may be a valid pulse.

It should be noted that, in the above embodiments, the driving transistor T1 may be a PMOS type transistor or an NMOS type transistor. FIG. 1 and FIG. 4 show the pixel circuits in which the driving transistors T1 are PMOS transistors. FIG. 5 and FIG. 6 show the pixel circuits in which the driving transistors T1 are NMOS transistors. In FIG. 1 and FIG. 5, the bias adjustment transistor T4 may be connected between the second terminal D of the driving transistor T1 and the bias adjustment signal line, and the bias adjustment signal V0 may be a high-level signal V0H. In FIG. 4 and FIG. 6, the bias adjustment transistor T4 may be connected between the first terminal S and the bias adjustment signal line. The bias adjustment signal V0 may be a low-level signal V0L. When the driving transistor T1 is turned on in the bias adjustment stage, the bias adjusting signal V0 may be transmitted between the first terminal S and the second terminal D of the driving transistor T1.

Similarly, other transistors in the pixel circuit (such as the reset transistor, the initialization transistor, the bias adjustment transistor, the compensation transistor, the data writing transistor, the first light-emitting control transistor and/or the second light-emitting control transistor, etc.) may also be PMOS transistors or NMOS transistors. For example, as shown in FIG. 1, the initialization transistor T3, the bias adjustment transistor T4, the data writing transistor T5, the first light-emitting control transistor T7 and the second light-emitting control transistor T8 may all be PMOS transistors, and the reset transistor T2 and the compensation transistor T6 may all be NMOS transistors. Or, as shown in FIG. 5, the initialization transistor T3, the data writing transistor T5, the first light-emitting control transistor T7 and the second light-emitting control transistor T8 may all be PMOS transistors, and the reset transistor T2, the bias adjustment transistor T4 and the compensation transistor T6 may all be NMOS transistors. The types of the transistors are not limited in the present disclosure, and depend on the practical configurations. It should be noted that, for a PMOS transistor, the valid pulse received by its gate may be a low-level signal, and the invalid pulse received by its gate is a high-level signal. For an NMOS transistor, the valid pulse received by its gate may be a high-level signal, and the invalid pulse received by its gate may be a low-level signal.

It should be noted that, as shown in FIG. 1, for the PMOS-type driving transistor T1, when the pixel circuit 10 is in a non-bias adjustment stage, such as the light-emitting stage, if the driving transistor T1 is at an on state, for example, when its gate potential is lower than a first potential, the driving transistor T1 may operate at a non-saturated state, and the voltage of its second terminal may often be lower than the gate potential, the PMOS transistor may be turned on. For the situation that the voltage second terminal is smaller than the gate potential, the voltage difference between the second terminal of the transistor and its gate may be relatively large, and the potential difference may be relatively large. As shown in FIG. 5, for the NMOS-type driving transistor T1, when the pixel circuit 10 is in a non-bias adjustment stage, such as the light-emitting stage, if the driving transistor T1 is at an on state, for example, when its gate potential is greater than the potential of the first terminal, the voltage of the second terminal may be PVDD, the NMOS transistor may be turned on. However, for the situation that the potential of the second terminal is greater than the gate potential, the voltage difference between the second terminal and the gate of the driving transistor may be often relatively large, the potential difference may be large. If such an arrangement is operated for a long time, the ions inside the driving transistor may be polarized, and then a built-in electric field may be formed inside the driving transistor, resulting in the constant increase of the threshold voltage of the driving transistor.

Figure 7:
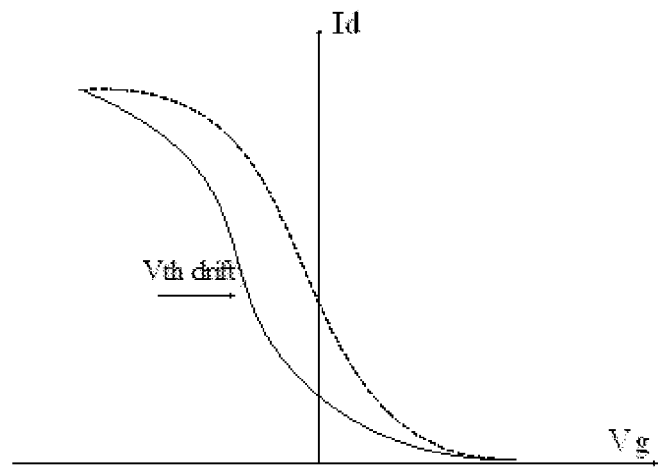
FIG. 7 illustrates a circuit connection structure of another exemplary detection device according to various disclosed embodiments of the present disclosure.

FIG. 7 shows a schematic diagram of the drift of the Id-Vg curve during the long-term operation of the driving transistor. The drift of the Id-Vg curve of the driving transistor T1 will affect the driving current flowing into the light-emitting element in the light-emitting stage. Thus, the display uniformity of the display screen is affected. For example, when the black screen is switched to a white screen, the display brightness will rise slowly, and it takes 4-5 frames of data refresh to stabilize the brightness. Since the recovery time is long, the human eye can observe the screen flickering.

In one embodiment of the present disclosure, the operation process of the pixel circuit 10 may include a bias adjustment stage. Taking the pixel circuit shown in FIG. 1 as an example, in the bias adjustment stage, the scan signal SV may be a valid pulse, the bias adjustment transistor T4 may be turned on. The bias adjustment signal V0 provided by the bias adjustment signal line may be written into the second terminal D of the driving transistor T1 through the turned on bias adjustment transistor T4 to adjust the potential difference between the second terminal and the gate of the driving transistor T1. It should be noted that, when the bias adjustment transistor T4 writes the bias adjustment signal V0 into the first terminal S of the driving transistor T1, if the driving transistor T0 is turned on in the bias adjustment stage, the bias adjustment signal V0 may also be transmitted from the first terminal S of the driving transistor T1 to the second terminal D of the driving transistor T1 to achieve the purpose of adjusting the potential difference between the second terminal and the gate of the driving transistor T1. Accordingly, the threshold voltage of the driving transistor T1 may be reduced in the bias adjustment stage, and the increment of the threshold voltage of the driving transistor T1 in the non-bias adjustment stages may be balanced. Thus, the degree of the drift of the Id-Vg curve may be reduced, and the display uniformity of the display panel may be improved.

It should be noted that, based on the above embodiments, in one embodiment of the present disclosure, when the driving transistor is a PMOS transistor, the bias adjustment signal V0 may be a constant high-level signal, for example, the voltage of the bias adjustment signal V0 may be fixed. In other embodiments of the present disclosure, the magnitudes of the bias adjustment signals in different bias adjustment stages may also be different. For example, the bias adjustment signal V0 may also be gradually changed; and may be gradually increased or decreased within a certain range in a data refresh period; or the bias adjustment signal V0 may a high-level signal with a certain floating range, which is not limited in this disclosure, depending on the practical situation. In one embodiment, the voltage of the bias adjustment signal V0 may be higher than the data signal Vdata received by the pixel circuit to achieve the effect of adjusting the threshold voltage shift of the driving transistor faster.

Similarly, when the driving transistor is an NMOS transistor, the bias adjustment signal V0 may be a constant low-level signal, for example, the voltage of the bias adjustment signal V0 may be fixed. The bias adjustment signal V0 may also be different in different bias adjustment stages. For example, the bias adjustment signal V0 may be gradually changed, and gradually increased or decreased within a certain range of a data refresh period; or the bias adjustment signal V0 may be a low-level voltage with a certain floating range. This disclosure does not limit the low-level signal, and it depends on the practical situation. In one embodiment, the voltage of the bias adjustment signal V0 may be lower than the data signal Vdata received by the pixel circuit to achieve a faster adjustment effect of the threshold voltage shift.

The following describes the related operation process of adjusting the threshold voltage of the driving transistor in the bias adjusting stage by taking the structure shown in FIG. 1 as an example.

As shown in FIG. 1, the driving transistor T1 may be a PMOS transistor, and the bias adjustment signal V0 may be a high-level signal V0H. In the bias adjustment stage, the compensation transistor T6 may be turned off, and the second terminal D of the driving transistor T1 may receive the high-level signal V0H. At this time, comparing with the non-bias adjustment stage, in the bias adjustment stage, the potential of the second terminal of the driving transistor T1 may be increased and adjusted to a certain extent such that the potentials of the gate, the first terminal S and the second terminal D of the driving transistor T1 may be adjusted in the bias adjustment stage. In one embodiment, the potential V0H of the second terminal of the driving transistor T1 may be higher than the potential of its gate. For example, the potential of the third node N3 may be higher than the potential of the first node N1 such that the driving transistor T1 may be reversely biased, thereby weakening the degree of the ion polarization inside the driving transistor. T1, and the threshold voltage of the driving transistor T1 may be reduced. By biasing the driving transistor T1, the threshold voltage of the driving transistor T1 may be adjusted, and the difference between the gate potential of the driving transistor T1 and the potential of its second terminal may be improved.

In one embodiment, based on the foregoing embodiment, the reset signal line may be multiplexed as an initialization signal line. For example, the first reset signal line may be multiplexed as the first reset signal line and the second reset signal line may be multiplexed as the second initialization signal line to reduce the number of signal lines in the display panel. In other embodiments, the first reset signal line and the first initialization signal line may also be two independent signal lines. Similarly, the second reset signal line and the second initialization signal line may also be two independent signal lines.

It should be noted that, in the pixel circuits of the above embodiments, the reset transistor and the bias adjustment transistor may be two independent transistors, but they are not limited in the present disclosure. In other embodiments of the present disclosure, the reset transistor can also be multiplexed as a bias adjustment transistor to reduce the number of transistors in the pixel circuit and simplify the structure of the pixel circuit.

The following describes the configuration where the reset transistor is multiplexed a bias adjustment transistor with reference to the specific circuit structure.

As shown in FIG. 8-FIG. 13, in one embodiment of the present disclosure, the pixel circuit may include a reset transistor T2, an initialization transistor T3 and a compensation transistor T6. The reset transistor T2 may be connected between the reset signal line and the first terminal S or the second terminal D of the driving transistor T1. The compensation transistor T6 may be connected between the gate and the second terminal D of the driving transistor T1. The initialization transistor T3 may be connected between the initialization signal line and the light-emitting element 20. It should be noted that, in the embodiment of the present disclosure, the operation process of the pixel circuit may include a bias adjustment stage. In the bias adjustment stage, the reset transistor T2 may be multiplexed as a bias adjustment transistor T4, and the reset signal line may be multiplexed a bias adjustment signal line. For example, the reset transistor in the first display area may be multiplexed as the bias adjustment transistor in the first display area, the first reset signal lines may be multiplexed as the first offset adjustment signal line; the reset transistor in the second display area may be multiplexed as the bias adjustment transistor in the second display area, and the second reset signal line may be multiplexed as the second bias adjustment signal line.

It should be noted that when the first reset signal line is multiplexed as the first bias adjustment signal line, the resistivity of the first reset signal line may be same as the resistivity of the first bias adjustment signal line, that is, ρ11=ρ13. Similarly, when the second reset signal line is multiplexed as the second bias adjustment signal line, the resistivity of the second reset signal line may be the same as the resistivity of the second bias adjustment signal line, that is, ρ21=ρ23.

In addition, in the display panel provided by the embodiment of the present disclosure, the pixel circuit further may include a data writing transistor T5, a first light-emitting control transistor T7 and a second light-emitting control transistor T8. The data writing transistor T5 may be connected between the signal line and the first terminal S of the driving transistor T1. The first light-emitting control transistor T7 may be connected between the power signal line and the first terminal S or the second terminal D of the driving transistor T1. The second light-emitting control transistor T8 may be connected between the second terminal D or the first terminal S of the driving transistor T1 and the light-emitting element 20.

The operation process of the pixel circuit may include a pre-stage and a light-emitting stage. The pre-stage includes a reset stage, an initialization stage, a bias adjustment stage and a threshold compensation stage. Because the corresponding operation processes of the initialization stage, the threshold compensation stage and the light-emitting stage may be similar to those of the pixel circuit shown in FIG. 1 and FIG. 4 to FIG. 6, the details are not repeated. The corresponding operation process of the pixel circuit in the reset stage and the bias adjustment stage when the reset transistor is multiplexed as a bias transistor is described as following.

Figure 8:
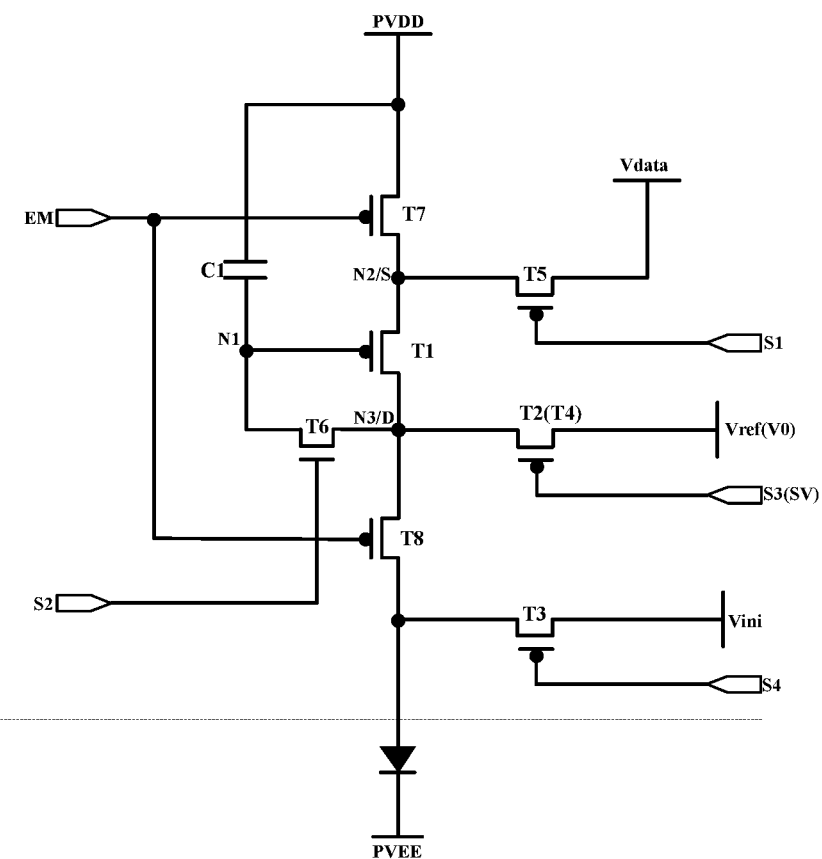
FIG. 8 illustrates a drift of Id-Vg curve during a long time operation of a driving transistor.

As shown in FIG. 8, in the reset stage, the scan signal S3 may be a valid pulse signal, and the scan signal S2 may be a valid pulse signal, the reset transistor T2 may be at an on state, the transmission path between the first terminal of the reset transistor T2 and the second terminal of the reset transistor T2 may be turned on, and the compensation transistor T6 may be at an on state. Thus, the transmission path between the first terminal and the second terminal of the compensation transistor T6 may be turned on. Accordingly, the reset signal Vref may be transmitted to the gate of the driving transistor T1 sequentially through the reset transistor T2 and the compensation transistor T6 to reset the gate of the driving transistor T1. After the reset of the gate of the driving transistor T1 is completed, the compensation transistor T6 may be turned off.

In the bias adjustment stage, the scan signal S3 may be a valid pulse signal, and the scan signal S2 may be an invalid pulse signal, the reset transistor T2 may be at an on state, the transmission path between the first terminal and the second terminal of the reset transistor T2 may be turned on, and the compensation transistor T6 may be at the off state, the transmission path between the first terminal and the second terminal of the compensation transistor T6 may be turned off. The reset signal Vref may be transmitted the first terminal S or the second terminal D of the driving transistor T1 through the reset transistor T2 to provide a bias adjustment signal Vref for the first terminal S or the second terminal D of the driving transistor T1 to achieve the purpose of adjusting the potential difference between the second terminal and the gate of the driving transistor T1. Accordingly, the threshold voltage of the driving transistor T1 may be reduced in the bias adjustment stage and the increase of the threshold voltage of the driving transistor T1 in the non-bias adjustment stages may be balanced to reduce the drift degree of the Id-Vg curve, and improve the display uniformity of the display panel.

In one embodiment, the reset transistor may be multiplexed as the bias adjustment transistor, and the reset signal line may be multiplexed as the bias adjustment signal line, on the basis of improving the display uniformity of the display panel, the number of transistors and the number of signal lines in the display panel may reduced, and the layout difficulty of transistors and signal lines in the display panel may be reduced.

Figure 9:
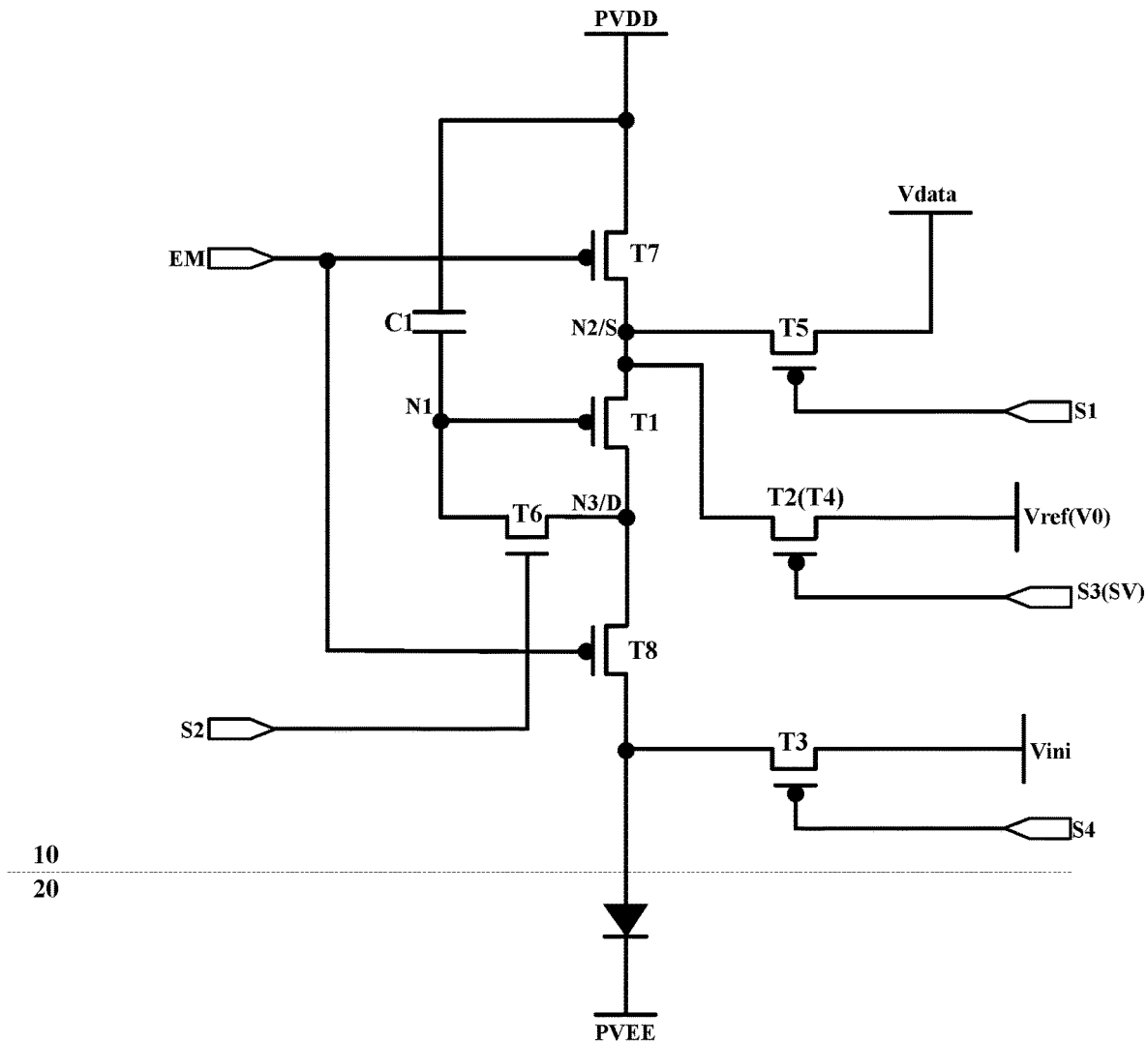
FIG. 9 illustrates a pixel circuit of another exemplary display panel according to various disclosed embodiments of the present disclosure.
Figure 10:
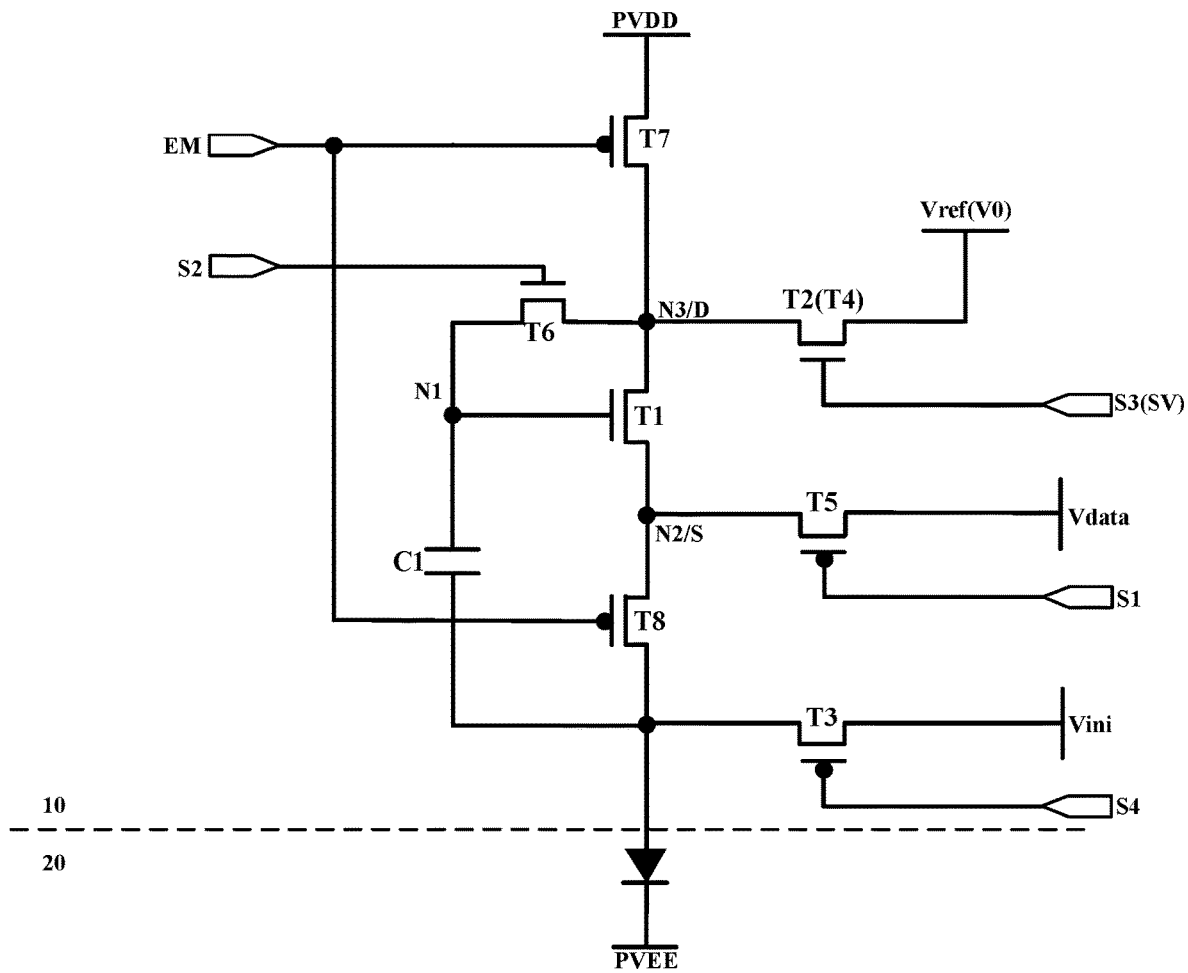
FIG. 10 illustrates a pixel circuit of another exemplary display panel according to various disclosed embodiments of the present disclosure.
Figure 11:
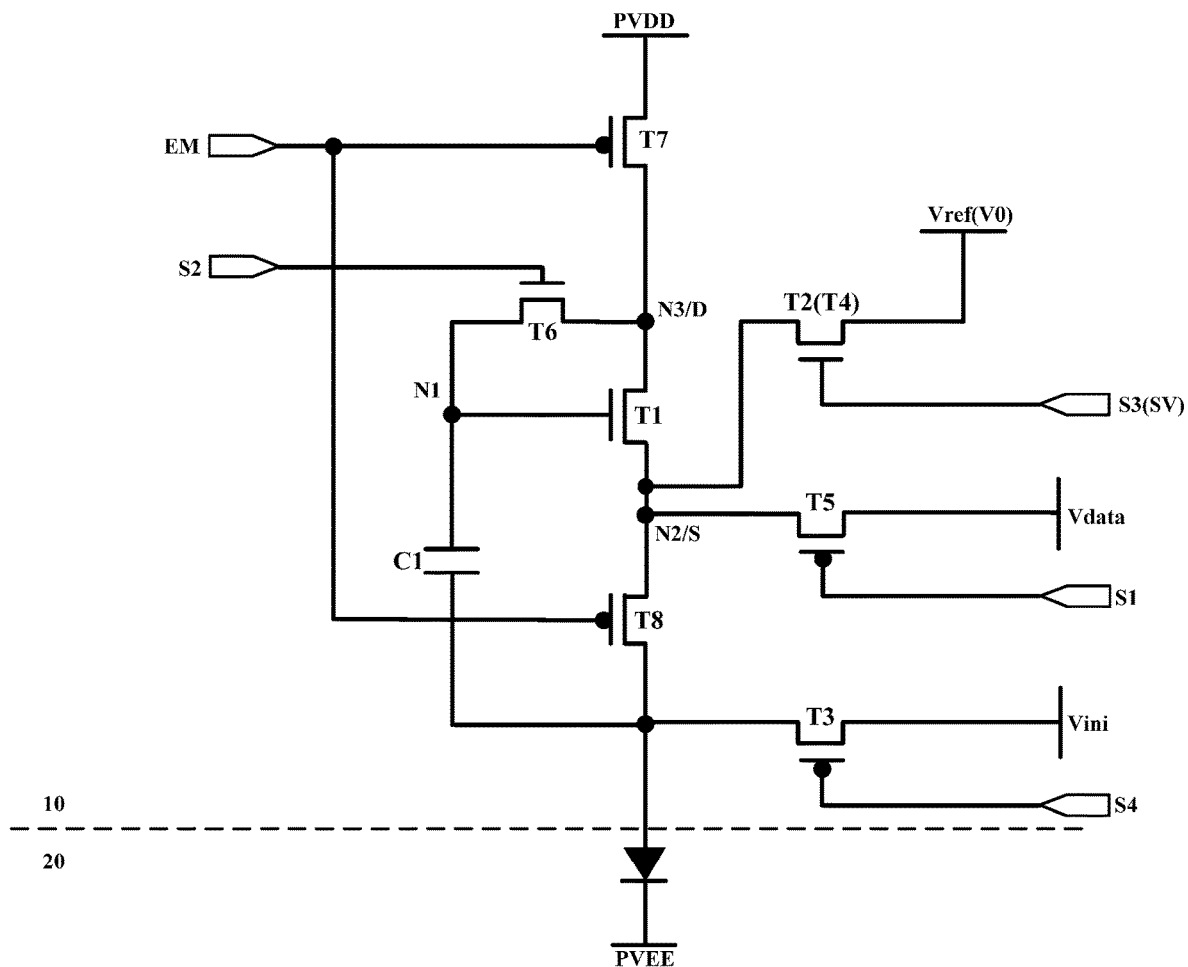
FIG. 11 illustrates a pixel circuit of another exemplary display panel according to various disclosed embodiments of the present disclosure.
Figure 12:
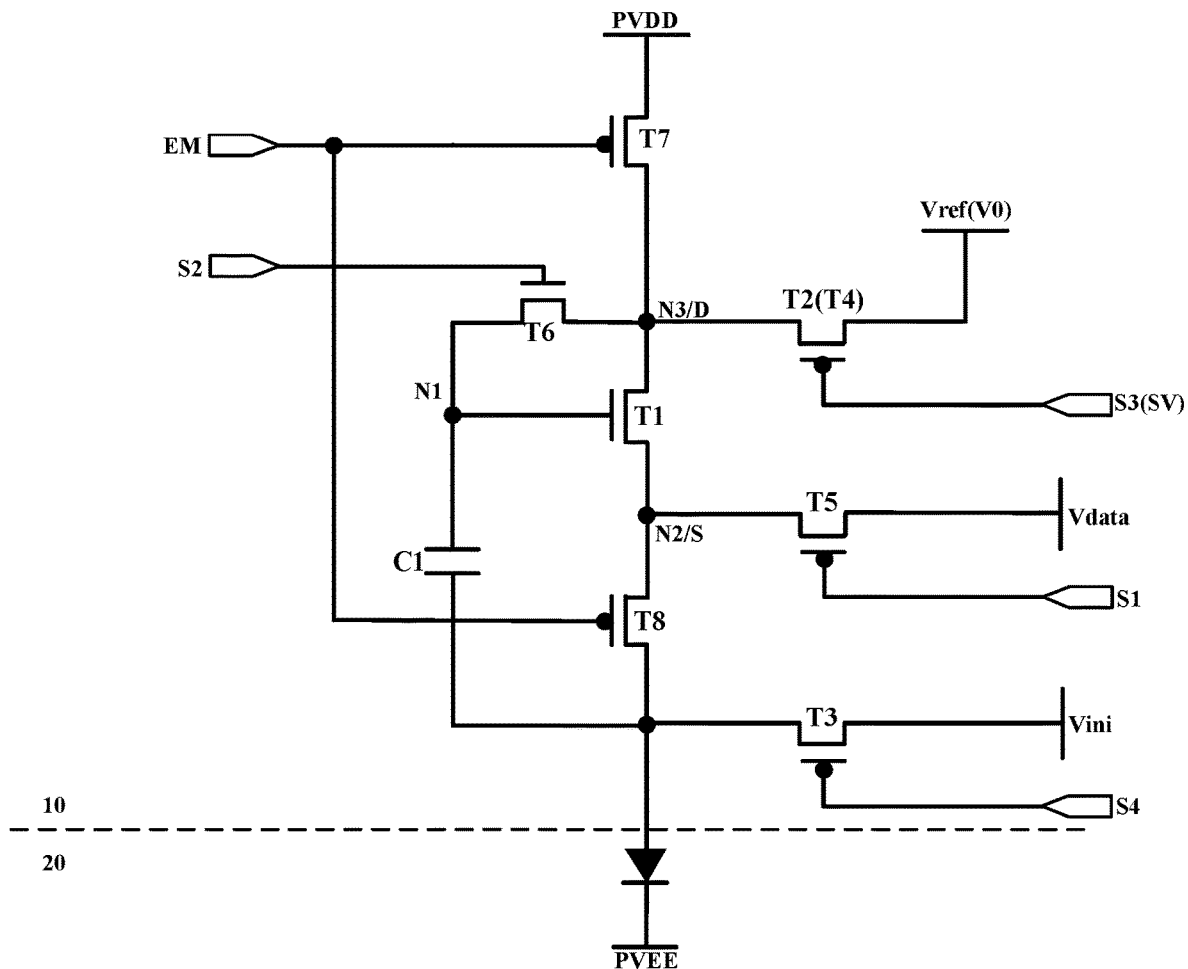
FIG. 12 illustrates a pixel circuit of another exemplary display panel according to various disclosed embodiments of the present disclosure.
Figure 13:
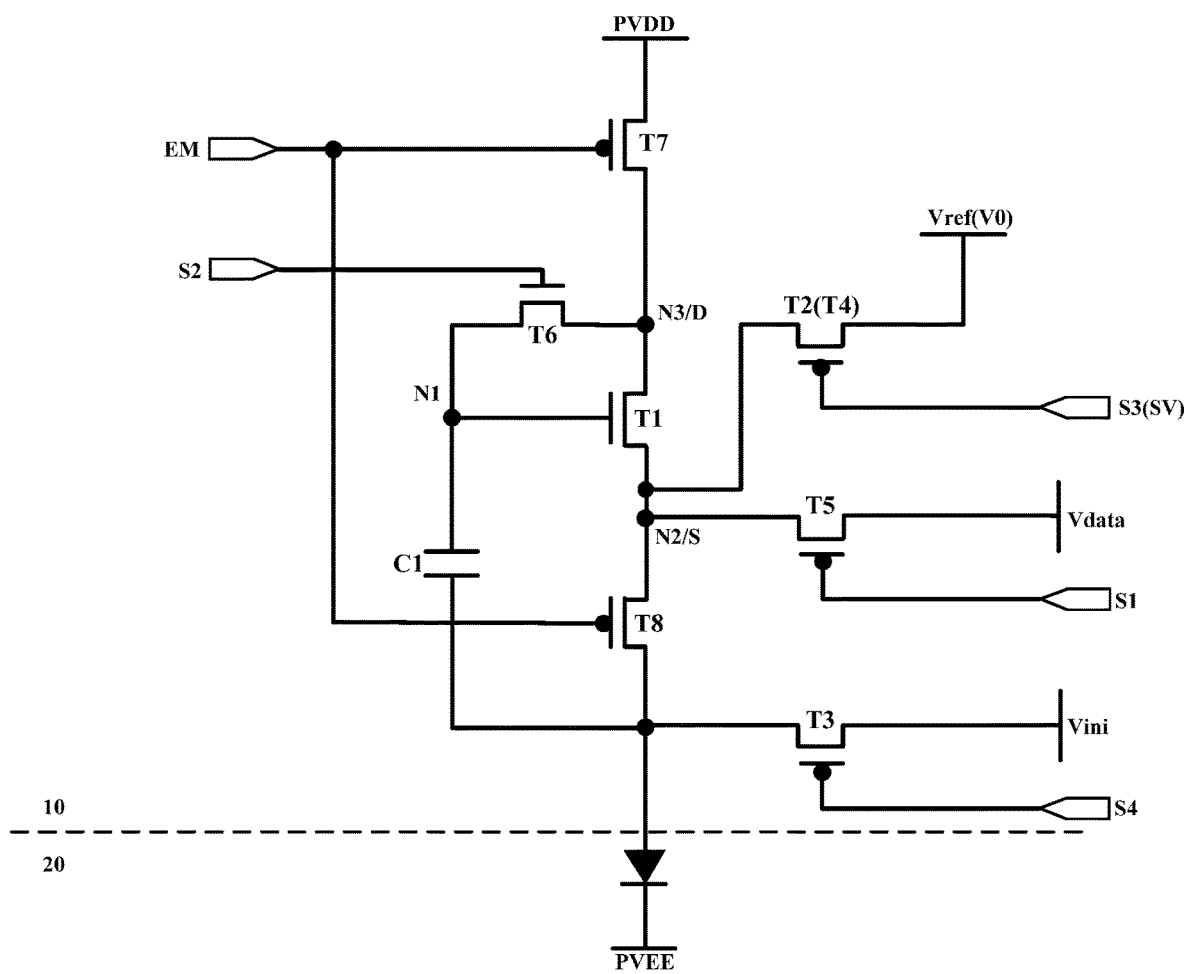
FIG. 13 illustrates a pixel circuit of another exemplary display panel according to various disclosed embodiments of the present disclosure.

In the above embodiments, the driving transistor T1 may be a PMOS type transistor or an NMOS transistor. FIGS. 8-9 show the pixel circuits in which the driving transistor T1 is a PMOS type transistor, and FIGS. 10-11 show the pixel circuits in which the driving transistor T1 is an NMOS type transistor. In FIG. 8 and FIG. 10, the reset transistor T2 may be connected between the second terminal D of the driving transistor T1 and the reset signal line. In the reset stage, the reset signal Vref may be a low-level signal, and in the bias adjustment stage, the reset signal Vref may be a high-level signal V0H. In FIG. 9 and FIG. 11, the reset transistor T2 may be connected between the first terminal S of the driving transistor T1 and the reset signal line. In the reset stage, the reset signal Vref may be a low-level signal, and in the bias adjustment stage, the reset signal Vref may also be a low-level signal.

Further, the reset transistor T2 may also be a PMOS type transistor or an NMOS type transistor. FIG. 8, FIG. 9, FIG. 12 and FIG. 13 show pixel circuits in which the reset transistor T2 is a PMOS transistor. FIGS. 10-11 show pixel circuits in which the reset transistor T2 is an NMOS transistor.

Similarly, other transistors (such as data writing transistors, compensation transistors, initialization transistors, first light-emitting control transistors, second light-emitting control transistors, etc.) in the pixel circuit may also be PMOS transistors or NMOS transistors; and the types of the transistors are not limited in the present disclosure, and may depend on the specific situation.

Based on the foregoing embodiments, in one embodiment of the present disclosure, the reset signal line may be multiplexed as an initialization signal line. For example, the first reset signal line may be multiplexed as the first initialization signal line. In the initialization stage, the reset signal Vref input by the first reset signal line may be a low-level signal; the second reset signal line may also be multiplexed as the second initialization signal line. In the initialization stage, the reset signal input by the second reset signal line may be a low-level signal to further reduce the number of signal lines in the display panel. In other embodiments of the present disclosure, the first reset signal line and the first initialization signal line may also be two independent signal lines. Similarly, the second reset signal line and the second initialization signal line may also be two independent signal lines.

The following describes the display panel provided by the embodiment of the present disclosure by taking an example that the reset signal line and the initialization signal line are two independent signal lines.

During the operation process of the display panel, the display of each frame of the display screen may include a pre-stage and a light-emitting stage. In the pre-stage, the operation process of the pixel circuit may include a reset stage, an initialization stage, a bias adjustment stage, and a threshold compensation stage. In the reset stage, the reset signal line resets the gate voltage of the driving transistor, and in the threshold compensation stage, the gate voltage of the driving transistor may be compensated to write the signal Vdata into the gate of the driving transistor. In the initialization stage, the initialization signal line may reset the anode of the light-emitting element such that, after entering the light-emitting stage, the driving current received by the light-emitting element may be accurate enough to achieve an accurate light-emission and ease the display screen flickering. The threshold compensation stage may occur after the reset stage.

It can be seen that the reset of the anode of the light-emitting element by the initialization signal line may directly affect the light-emitting performance of the light-emitting element. The anode of the light-emitting element may need to be fully reset to ensure that the driving current received by the light-emitting element is accurate enough when each frame of the display screen is displayed. Accordingly, the light-emitting element may emit light accurately and the probability of flickering of the display screen may be reduced. After the reset signal line resets the gate of the driving transistor, the gate of the driving transistor may also receive the data writing signal in the threshold compensation stage, that is, the reset voltage of the reset signal line to the gate of the driving transistor may not directly affect the data retention frame to display. That is, comparing with the gate reset process of the driving transistor, the anode reset process of the light-emitting element may have a greater impact on the drive current of the light-emitting element, and may have a greater impact on the display quality of the display screen. For example, comparing with the driving transistor, the switching performance of the initialization transistor may have a greater impact on the display quality of the display screen. Correspondingly, comparing with the reset signal line, the initialization signal line may have higher requirements on the resistivity.

In one embodiment, based on $\rho11+\rho12+\rho13 \leq \rho21+\rho22+\rho23$, $\rho11<\rho21$, and/or, $\rho12<\rho22$, and/or, $\rho13<\rho23$. For example, the first reset signal line and the second reset signal line may be located in different layers, and/or the first initialization signal line and the second initialization signal line may be located in different layers, and/or the first bias adjustment signal line and the second bias adjustment signal line may be located in different film layers.

Based on this, in one embodiment of the present disclosure, $\rho11>\rho12$, such that the first initialization signal line with higher resistivity requirements may be arranged in the layer with a smaller signal resistivity, and the first reset signal line with lower resistivity requirements may be disposed on the layer with a higher resistivity. Such a configuration may further reduce the number of signal lines in the layer where the first initialization signal lines are located on the basis to give priority to ensuring the working performance of the initialization transistor that may have a greater impact on the display quality of the display image in the pixel circuit, and to facilitate the layout of the first initialization signal line and the setting of the transmission area of the second display area.

Similarly, in one embodiment of the present disclosure, $\rho21>\rho22$, such that the second initialization signal line that may have higher resistivity requirements may be arranged in the layer with a smaller signal resistivity, and the second reset signal line that may have lower resistivity requirements may be disposed the layer with a higher resistivity. Such a configuration may further reduce the number of signal lines in the layer where the second initialization signal lines are located on the basis to give priority to ensuring the working performance of the initialization transistor that may have a greater impact on the display quality of the display screen in the pixel circuit, and to facilitate the layout of the second initialization signal line and the setting of the transmission area of the second display area.

It should be noted that, in the operation process of the pixel circuit, the bias adjustment stage may occur before the threshold compensation stage, and may be configured to adjust the potential difference between the second terminal and the gate of the driving transistor T1 to reduce the threshold voltage of the driving transistor T1. Accordingly, the increase of the threshold voltage of the driving transistor T1 in the non-bias adjustment stages may be balanced, and the degree of shift of the Id-Vg curve of the driving transistor T1 may be reduced. The Id-Vg curve of the driving transistor T1 may directly affect the display uniformity of the display panel.

It can be seen that, in the bias adjustment stage, the bias adjustment transistor may adjust the electric field inside the driving transistor, thereby adjusting the Id-Vg curve of the driving transistor, and thereby adjusting the display uniformity of the display panel. Therefore, comparing with the gate reset process of the driving transistor, the bias adjustment process of the driving transistor may have a greater impact on the display quality of the display image. For example, comparing with the driving transistor, the state switching performance of the bias adjustment transistor may have a greater impact on the display quality of the display image. Correspondingly, comparing with the reset signal line, the bias adjustment signal line may have higher requirements on the resistivity.

Based on this, in one embodiment of the present disclosure, $\rho11>\rho13$, such that the first bias adjustment signal line that may have higher resistivity requirements may be disposed on the layer with a smaller signal resistivity, and the first reset signal line that may have lower resistivity requirements may be disposed in a layer with a large resistivity. Accordingly, the number of signal lines in the layer where the first bias adjustment signal line is located may be reduce on the basis to ensure the working performance of the bias adjustment transistor that has a greater impact on the display quality of the display screen in the pixel circuit, and to facilitate the layout of the first bias adjustment signal line and the setting of the transmission area of the second display area.

Similarly, in one embodiment of the present application, $\rho21>\rho23$, such that the second bias adjustment signal line that may have higher resistivity requirements may be arranged in the layer with a smaller signal resistivity, and the second reset signal line that may have lower resistivity requirements may be disposed in a layer with a larger resistivity. Accordingly, the number of signal lines in the layer where the second bias adjustment signal line is located may be reduced on the basis to preferentially ensure the working performance of the bias adjustment transistor that has a greater impact on the display quality of the display screen in the pixel circuit, and to facilitate the layout of the second bias adjustment signal line and the setting of the transmission area of the second display area.

It should be noted that, as can be seen from the foregoing embodiments, although the state switching performance of the bias adjustment transistor and the state switching performance of the initialization transistor may directly affect the uniformity of the display screen, the initialization transistor may be directly connected to the anode of the light-emitting element, and it may have a greater influence on the driving current of the light-emitting element. Therefore, comparing with the bias adjustment transistor, the state switching performance of the initialization transistor may have a greater impact on the display quality of the display screen. Correspondingly, comparing with the bias adjustment signal line, the initialization signal line may have higher requirements on the resistivity.

Based on this, in one embodiment of the present disclosure, $\rho13>\rho12$, such that the first initialization signal line that may have higher resistivity requirements may be disposed in the layer with a smaller signal resistivity, and the first bias adjustment signal line that may have lower resistivity requirements may be disposed in the layer with a higher resistivity. Accordingly, the number of signal lines in the layer where the first initialization signal line is located may be reduced on the basis to give priority to ensure the working performance of the initialization transistor that has a greater impact on the display quality of the display screen in the pixel circuit, and to facilitate the layout of the first initialization signal line and the setting of the transmission area of the second display area.

Similarly, in one embodiment of the present disclosure, $\rho23>\rho22$, such that the second initialization signal line that may have higher resistivity requirements may be disposed in the layer with a smaller signal resistivity, and the second bias adjustment signal line that may have lower resistivity requirements may be disposed on the layer with a higher resistivity. Accordingly, the number of signal lines in the layer where the second initialization signal line is located may be reduced on the basis to give priority to ensuring the working performance of the initialization transistor that has a greater impact on the display quality of the display screen in the pixel circuit, and to further facilitate the layout of the second initialization signal line and the setting of the transmission area of the second display area.

It can be seen from the foregoing embodiments that, among the reset signal line, the initialization signal line and the bias adjustment signal line, the initialization signal line may have the highest requirement for resistivity, the bias adjustment signal line may have the second highest requirement for resistivity, and the reset signal line has the lowest requirement for resistivity. Therefore, in one embodiment of the present disclosure, $\rho11>\rho12$ and $\rho11>\rho13$, and/or, $\rho21>\rho22$ and $\rho21>\rho23$ to dispose the initialize signal line and the bias adjustment line that may have the higher resistivity requirements on the layer with the lower signal resistivity, and dispose the reset signal line with the relatively low resistivity requirements on the layer with a higher resistivity. Accordingly, the number of signal lines in the layer where the initialization signal line is located may be further reduced on the basis of ensuring the working performance of the initialization transistor and the bias adjustment transistor, which have a great influence on the display quality, and to facilitate the layout of the initialization signal line and the transmission area of the second display area. setting.

In another embodiment of the present disclosure, $\rho11>\rho13>\rho12$ and/or $\rho21>\rho23>\rho22$, such that the signal lines with different resistivity requirements may be disposed on different layers. For example, the initialization signal line that may have the highest resistivity requirements may be on the layer with the smallest signal resistivity, the bias adjustment signal line with the second highest resistivity requirements may be disposed on the layer with the next smallest signal resistivity, and the reset signal line with the lowest resistivity requirements may be disposed on the layer with the largest resistivity.

Because the first display area may not require a high transmittance, it may be mainly configured to realize the display function, the second display area may be provided with a transmission area based on being configured to realize the display function, the light transmittance performance should also be considered. Therefore, in the embodiments of the present disclosure, comparing with each signal line that may provide a signal to each pixel circuit of the second display area, the display panel may have high resistivity requirements for each signal line that provides a signal to each pixel circuit of the first display area. It can also be seen from the foregoing embodiments that, among the reset signal line, the initialization signal line, and the bias adjustment signal line, the bias adjustment signal line may have a medium requirement for resistivity.

Therefore, in one embodiment of the present disclosure, $(\rho23-\rho13)>(\rho22-\rho12)$ and/or $(\rho23-\rho13)>(\rho21-\rho11)$, further, $(\rho23-\rho13)>(\rho22-\rho12)\geq(\rho21-\rho11)$, such that the first bias adjustment signal line of the first display area may be disposed on the layer with a lower signal line resistivity, and the second bias signal line of the second display area may be disposed on the layer with the larger signal line resistivity. For example, the first initialization signal line and the second initialization signal line may be disposed on a same layer, and the first reset signal line and the second reset signal line may be disposed on a same layer. The first bias adjustment signal line and the second bias adjustment signal line may be disposed on different layers to take into account the number of signal lines on the layer with a lower signal line resistivity and the overall quality of the display screen of the display panel.

It should be noted that, the first initialization signal line and the second initialization signal line may be disposed in the same layer, when the first reset signal line and the second reset signal line are disposed in the same layer, the first initialization signal line and the second initialization signal line may be disposed on a layer with a smaller resistivity, and the first reset signal line and the second reset signal line may be disposed on a layer with a larger resistivity. In other embodiments of the present disclosure, the first initialization signal line, the second initialization signal line, the first reset signal line and the second reset signal line may also adopt other setting manners.

In addition, in other embodiments, $(\rho22-\rho12)>(\rho21-\rho11)$, and/or, $(\rho22-\rho12)>(\rho23-\rho13)$. Further, $(\rho22-\rho12)>(\rho23-\rho13)\geq(\rho21-\rho11)$. Under such a condition, the first initialization signal line and the second initialization signal line may be disposed in different layers. In other embodiments, $(\rho21-\rho11)>(\rho22-\rho12)$ and/or, $(\rho21-\rho11)>(\rho23-\rho13)$. Further, $(\rho21-\rho11)>(\rho23-\rho13)\geq(\rho22-\rho12)$. Under such a condition, the first reset signal line and the second reset signal line may be disposed in different layers.

Figure 14:
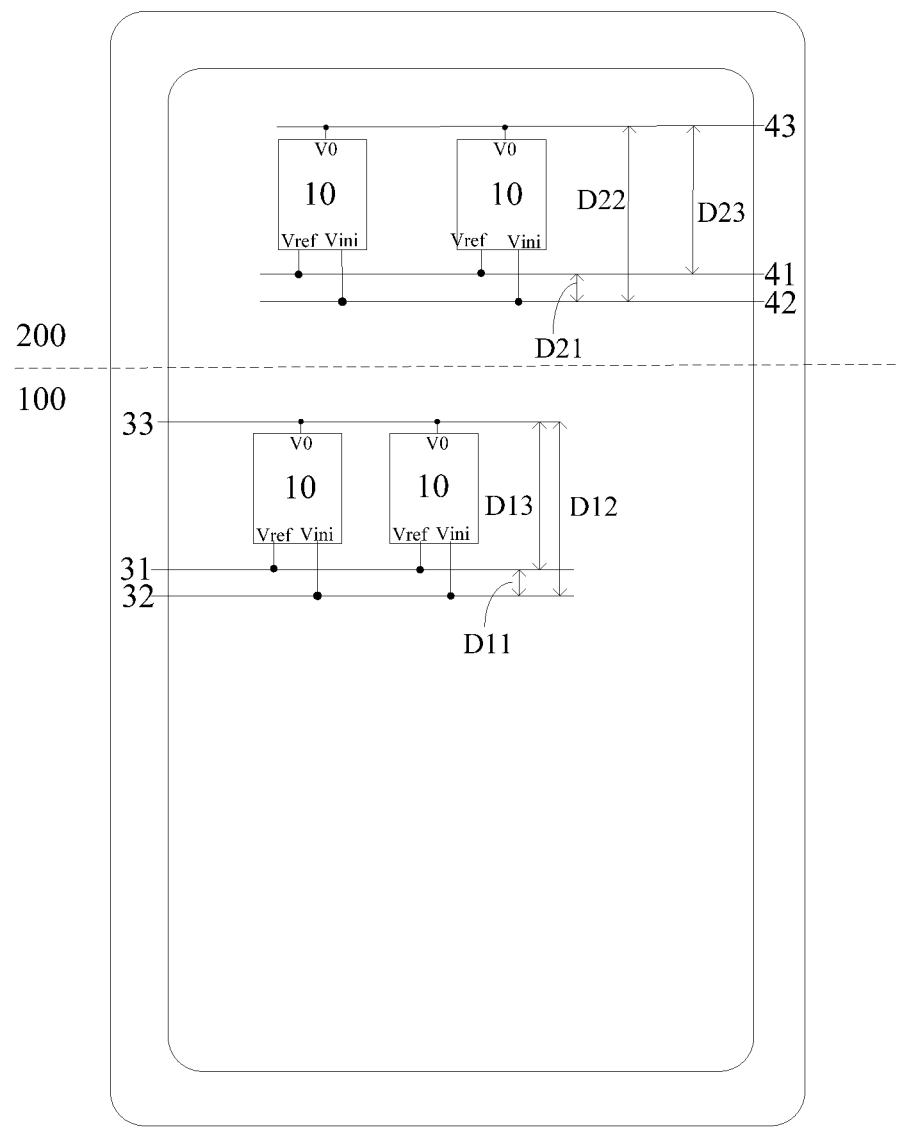
FIG. 14 illustrates a top view of another exemplary display panel according to various disclosed embodiments of the present disclosure.

On the basis of any of the above embodiments, in one embodiment of the present disclosure, as shown in FIG. 14, when being orthographically projected to a plane parallel to the surface of the display panel, the distance between the first reset signal line and the first initialization signal lines may be D11, the distance between the first initialization signal line and the first bias adjustment signal line may be D12, and the distance between the first reset signal line and the first bias adjustment signal line may be D13. When being orthographically projected to a plane parallel to the surface of the display panel, the distance between the second reset signal line and the second initialization signal line may be D21, the distance between the second initialization signal line and the second bias adjustment signal lines may be D22, and the distance between the second reset signal line and the second bias adjustment signal line may be D23.

It can be seen from the foregoing embodiment that the first display area may mainly need to realize the display function, and the transmittance may not be required very high. Therefore, the layout of each signal line in the first display area may mainly consider its signal transmission. For example, the signal line may be disposed on the layer with a small resistivity, and the insulating effect between adjacent signal lines may be considered. However, the second display area may not only need to realize the display function, but also may have a transmission area, and may need to realize the light transmission function. Therefore, the layout of each signal line in the second display area may also need to consider the area of the transmission area.

Therefore, in one embodiment of the present disclosure, when being orthographically projected to the plane parallel to the surface of the display panel, the distance between the first reset signal line and the first initialization signal line may be greater than the distance between the second reset signal line and the second initialization signal line, that is, D11>D21, such that there may be a larger distance between the first reset signal line and the first initialization signal line in the first display area. Accordingly, the probability of short circuit between the first initialization signal line and the first reset signal line and the parasitic capacitance may be reduced and the insulation between the first reset signal line and the first initialization signal line may be ensured. Further, the second reset signal line and the second initialization signal line in the second display area may have a relatively small distance, the space occupied by the second reset signal line and the second initialization signal line may be reduced. Accordingly, the second display area may have more space for setting the transmission area, and the area of the transmission area may be increased.

Based on any of the above embodiments, in one embodiment of the present disclosure, when being orthographically projected to a plane parallel to the surface of the display panel, the distance between the first initialization signal line and the first bias adjustment signal line may be greater than the distance between the second initialization signal line and the second bias adjustment signal line, that is, D12>D22, such that the first initialization signal line and the first bias adjustment signal line of the first display area may have a large distance to reduce the probability of short circuit between the first initialization signal line and the first bias adjustment signal line and reduce the parasitic capacitance, and to ensure that the first initialization signal line and the first bias adjustment signal line may be insulated from each other. Further, the distance between the second initialization signal line and the second bias adjustment signal line in the second display area may be made relatively small to reduce the space occupied by the second initialization signal line and the second bias adjustment signal line. Accordingly, the second display area may have more space to set the transmission area and the area of the transmission area may be increased.

Based on any of the above embodiments, in one embodiment of the present disclosure, when being orthographically projected on a plane parallel to the surface of the display panel, the distance between the first reset signal line and the first bias adjustment signal line may be greater than the distance between the second reset signal line and the second bias adjustment signal line, that is, D13>D23, such that the first reset signal line and the first bias adjustment signal line of the first display area are may have a large distance to reduce the probability of short circuit between the first reset signal line and the first bias adjustment signal line and reduce the parasitic capacitance, and ensure that the first reset signal line and the first bias adjustment signal line are insulated from each other. Further, the second reset signal line and the second offset adjustment signal line in the second display area may have a small distance to reduce the space occupied by the second reset signal line and the second bias adjustment signal line. Accordingly, the second display may have more space to set the transmission area; and the area of the transmission area may be reduced.

Figure 15:
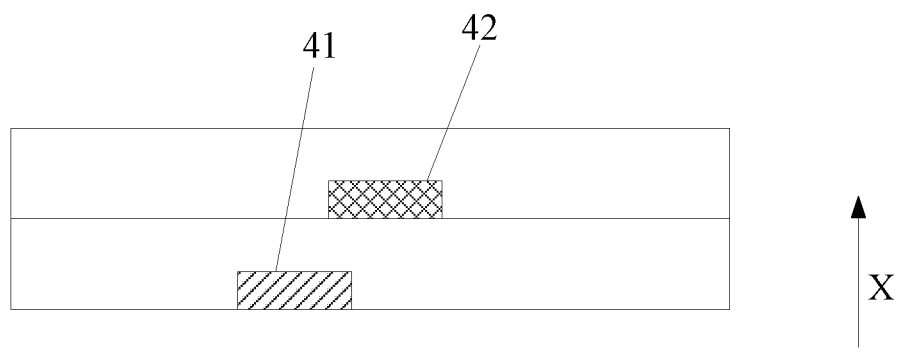
FIG. 15 illustrates a positional relationship between a second reset signal line and a second initialization signal line in an exemplary display panel according to various disclosed embodiments of the present disclosure.

Based on any of the above-mentioned embodiments, in one embodiment of the present disclosure, as shown in FIG. 15, in a direction X perpendicular to the surface of the display panel, the second reset signal line 41 may at least partially overlap the second initialization signal line 42 to ensure a mutual insulation between the second reset signal line 41 and the second initialization signal line 42 by disposing the second reset signal line 41 and the second initialization signal line 42 on different layers. In the direction X perpendicular to the surface of the display panel, the second reset signal line 41 and the second initialization signal line 42 may at least partially overlap to further reduce the space occupied by the second reset signal line 41 and the second initialization signal line 42 in the plane where the orthographic projection parallel to the surface of the display panel, and allow the second display area to have more space used as the transmission area in and increase the area of the transmission area.

In one embodiment, the signal lines in the layers where the second reset signal line and the second initialization signal line are located may have different resistivities. For example, the second reset signal line and the second initialization signal line may be disposed in the layers of different resistivities.

Figure 16:
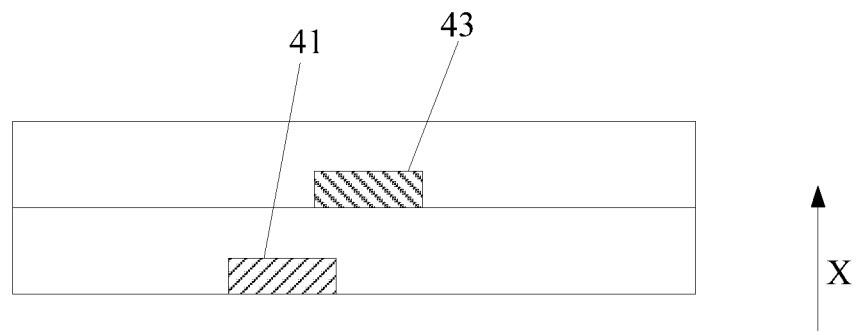
FIG. 16 illustrates a positional relationship between a second reset signal line and a second bias adjustment signal line in an exemplary display panel according to various disclosed embodiments of the present disclosure.

Based on any of the above embodiments, in one embodiment of the present disclosure, as shown in FIG. 16, in the direction X perpendicular to the surface of the display panel, the second reset signal line 41 may at least partially overlap the second bias adjustment signal line 43 to ensure that the second reset signal line 41 and the second bias adjustment signal line 41 are insulated from each other by disposing the second reset signal line 41 and the second bias adjustment signal line 43 on different film layers. Further, in the direction X perpendicular to the surface of the display panel, the second reset signal line 41 and the second bias adjustment signal line 43 may at least partially overlap to further reduce the space occupied the second reset signal line 41 and the second bias adjust signal line 43 on the plane where the orthographic projection is parallel to the surface of the display panel such that the second display area may have more space to set the transmission area, and the area of the transmission area may be increased.

In one embodiment, the signal lines in the layer where the second reset signal line and the second bias adjustment signal line are located may have different resistivities. For example, the second reset signal line and the second bias adjustment signal line may be located in the layer having different resistances.

Figure 17:
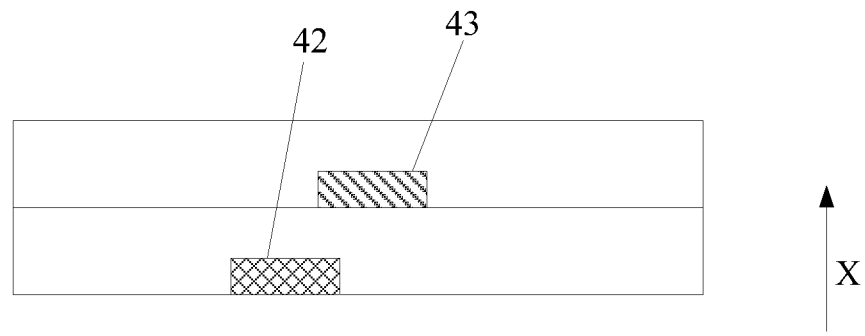
FIG. 17 illustrates a positional relationship between a second initialization signal line and a second bias adjustment signal line in an exemplary display panel according to various disclosed embodiments of the present disclosure.

Based on any of the above embodiments, in one embodiment of the present disclosure, as shown in FIG. 17, in the direction X perpendicular to the surface of the display panel, the second initialization signal line 42 may at least partially overlap the second bias adjustment signal lines 43 to ensure that the second initialization signal line 42 and the second bias adjustment signal line 42 are insulated from each other by disposing the second initialization signal line and the second bias adjustment signal line 43 on different film layers. Further, in the direction X perpendicular to the surface of the display panel, the second initialization signal line 42 and the second bias adjustment signal line 43 may at least partially overlap to further reduce the space occupied by the second initialization signal line 42 and the second offset adjustment signal line 43 in the plane where the orthographic projection is parallel to the surface of the display panel such that the second display area may have more space to set the transmission area, and the area of the transparent area is increased.

In one embodiment, the signal lines of the layers where the second initialization signal line and the second bias adjustment signal line are located may have different resistivities. For example, the second initialization signal line and the second bias adjustment signal line are located at different layers with different resistances.

Based on any of the above embodiments, in one embodiment of the present disclosure, the first reset signal line and the second reset signal line may be located in different layers to reduce the number of signal lines in the layer where the first reset signal line is located to facilitate the layout of the first reset signal line and reduce the probability of short circuit of the first reset signal lines. Similarly, the first initialization signal line and the second initialization signal line may be disposed in different layers to reduce the number of signal lines in the layer where the first initialization signal line is located to facilitate the layout of the first initialization signal line and reduce the probability of short circuit of the first initialization signal line. The first bias adjustment signal line and the second bias adjustment signal line may be located in different layers to reduce the number of signal lines in the layer where the first bias adjustment signal line is located to facilitate the layout of the first bias adjustment signal line and reduces the probability of short circuit of the first bias adjustment signal line.

In one embodiment of the present disclosure, at least one of the reset signal line, the initialization signal line and the bias adjustment signal line located in the first display area and the rest of the three signal lines in the second display area may be located in different layers. For example, the first reset signal line and the second reset signal line may be located in different layers, and/or the first initialization signal line and the second initialization signal line may be located in different layers, and/or the first bias adjustment signal line and the second bias adjustment signal line may be located in different layers.

In another embodiment of the present disclosure, at least two kinds of signal lines among the three kinds of signal lines of the reset signal line, the initialization signal line and the bias adjustment signal line located in the first display area and the rest of signal line located in the second display area may be disposed in different layers. For example, the first reset signal line and the second reset signal line may be disposed in different film layers and the first initialization signal line and the second initialization signal line may be disposed in different layers, and/or, the first reset signal line and the second reset signal line may be disposed in different film layers, and the first bias adjustment signal line and the second bias adjustment signal line may be disposed located in different layers, and/or, the first initialization signal line and the second initialization signal line may be disposed in different layers, and the first bias adjustment signal line and the second bias adjustment signal line may be disposed in different layers.

In still another embodiment of the present disclosure, the reset signal line, the initialization signal line and the bias adjustment signal line located in the first display area and the rest of the signal lines located in the second display area may be disposed in different layer. For example, the first reset signal line and the second reset signal line may be disposed in different layers, and the first initialization signal line and the second initialization signal line may be disposed in different layers, and the first reset signal line and the second initialization signal line may be disposed in different layers, and the first bias adjustment signal line and the second bias adjustment signal line may be disposed in different layers.

Based on any of the above embodiments, in one embodiment of the present disclosure, at least two of the first reset signal line, the first initialization signal line and the first bias adjustment signal line may be located in a same layer such that at least two signal lines among the first reset signal line, the first initialization signal line and the first bias adjustment signal line may be disposed on the layer with lower signal line resistivity to ensure the display characteristic of the first display area.

Based on any of the above embodiments, in one embodiment of the present disclosure, the second reset signal line, the second initialization signal line, and the second bias adjustment signal line may all be disposed on different film layers to reduce the number of signal lines on the layer where each signal line of the second display area is located, thereby reducing the space occupied by each signal line of the second display area on the layer where the signal line is located. Accordingly, the second display area may have more area for disposing the transmission area and to ensure the area of the transmission area.

In one embodiment of the present disclosure, two of the first reset signal line, the first initialization signal line, and the first bias adjustment signal line may be disposed in a first layer, and the other may be disposed in the second film layer. The resistivity of the first layer may be smaller than the resistivity of the second layer such that the resistivity of at least two signal lines of the first reset signal line, the first initialization signal line and the first bias adjustment signal lines may be relatively small to ensure the display characteristics of the first display area.

Figure 18:
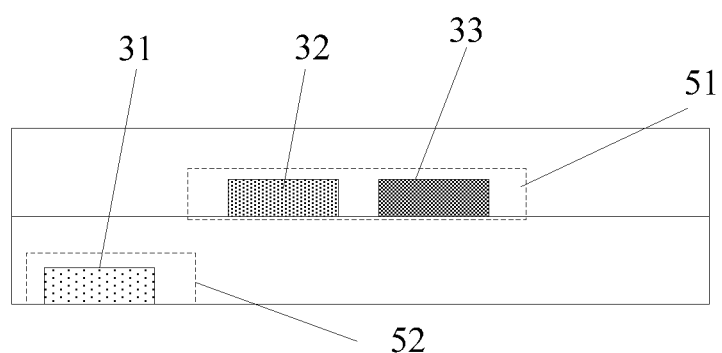
FIG. 18 illustrates a positional relationship between a first reset signal line, a first initialization signal line and a first bias adjustment signal line in an exemplary display panel according to various disclosed embodiments of the present disclosure.

It can be seen from the foregoing description that, among the reset signal line, the initialization signal line and the bias adjustment signal line, the initialization signal line may have the highest requirement for resistivity, and the bias adjustment signal line may have the second highest requirement for resistivity. Therefore, in one embodiment of the present disclosure, as shown in FIG. 18, the first initialization signal line 32 and the first bias adjustment signal line 33 may be disposed in the first layer 51, and the first reset signal line 31 may be disposed in the second layer 52 such that, on the basis that the first layer 51 may only be used to dispose two signal lines among the first initialization signal line 32, the first bias adjustment signal line 33 and the first reset signal line 31, the display characteristics of the first display area may be improved as much as possible, but the present disclosure does not limit this. In other embodiments of the disclosure, the first reset signal line and the first initialization signal line may also be disposed in the first layer, and the first bias adjustment signal line may be disposed in the second layer; or the first reset signal line and the first bias adjustment signal line may be disposed in the first layer, and the first initialization signal line may be disposed in the second layer.

Based on any of the above embodiments, in one embodiment of the present disclosure, the second reset signal line may be disposed in a third layer, the second initialization signal line may be disposed in a fourth film layer, and the second bias adjustment signal line may be disposed in a fifth film layer. It can be seen from the foregoing description that, among the reset signal line, the initialization signal line and the bias adjustment signal line, the initialization signal line may have the highest requirement for resistivity, and the bias adjustment signal line may have the second highest requirement for resistivity. Therefore, in one embodiment of the present disclosure, the resistivity of the fourth layer may be smaller than the resistivity of the fifth layer, and/or the resistivity of the fifth layer may be smaller than the resistivity of the third layer such that, on the basis of disposing the second reset signal line, the second initialization signal line and the second bias adjustment signal line on the layers with different resistivities, the resistivity of the film layer where the second reset signal line, the second initialization signal line and the second bias adjust line are located may be reasonably arranged to ensure the display characteristics of the second display area. However, the present disclosure does not limit this, and it may depend on the specific situation.

Figure 19:
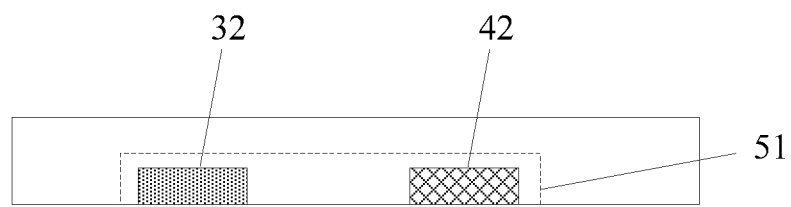
FIG. 19 illustrates a positional relationship between a first initialization signal line and a second initialization signal line in an exemplary display panel according to various disclosed embodiments of the present disclosure.

It can be seen from the foregoing description that, among the reset signal line, the initialization signal line and the bias adjustment signal line, the initialization signal line may have the highest requirements on resistivity, the fourth layer and the first layer may be the same layer such that the first initialization signal line and the second initialization signal line may be both disposed on the same layer with a smaller resistivity. As shown in FIG. 19, both the first initialization signal line 32 and the second initialization signal line 42 may be disposed on the first layer 51, thereby improving the state switching performance of the initialization transistor, and improving the display characteristics of the first display area and the second display area.

In addition, among the reset signal line, the initialization signal line, and the bias adjustment signal line, the bias adjustment signal line may have the second highest requirement for resistivity. Therefore, based on any of the above embodiments, in one embodiment of the present disclosure, the third layer and the second layer may be the same film layer such that the first bias adjustment signal line and the second bias adjustment signal line may be disposed on the layer with a medium resistivity. For example, the first bias adjustment signal line and the second bias adjustment signal line may be disposed on the layer with the medium resistivity. Accordingly, on the basis of reducing the number of signal lines on the layer with the smaller resistivity, the resistivity of the first bias adjustment signal line and the second bias adjustment signal line may not be too large to ensure the display characteristics of the first display area and the second display area. However, the present disclosure does not limit this, and it may depend on the specific situation.

It should be noted that the key parameter that determines the signal transmission rate on the signal line may be the resistance of the signal line, and the factors affecting the resistance of the signal line may include the line width of the signal line in addition to the resistivity of the signal line. Under the premise that other parameters except the resistivity is fixed, the smaller the resistivity of the signal line is, the smaller the resistance of the signal line is. Under the premise that other parameters except the line width is fixed, the larger the line width of the signal line is, the smaller the resistance of the signal line is.

Figure 20:
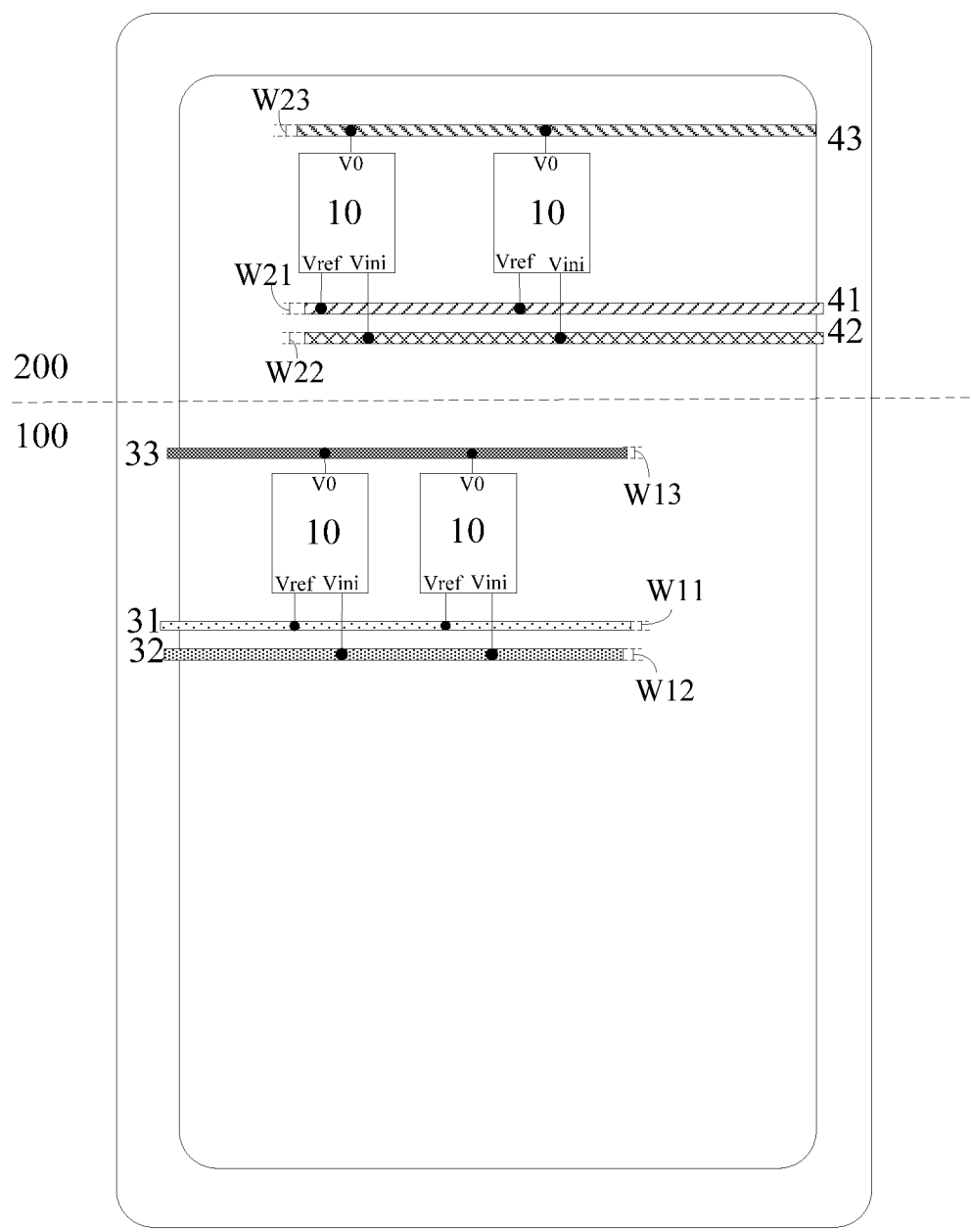
FIG. 20 illustrates a top view of another exemplary display panel according to various disclosed embodiments of the present disclosure.

Based on any of the above embodiments, in one embodiment of the present disclosure, as shown in FIG. 20, the line width of the first reset signal line 31 may be W11, the line width of the first initialization signal line 32 may be W12, the line width of the first bias adjustment signal line 33 may be W13, the line width of the second reset signal line 41 may be W21, the line width of the second initialization signal line 42 may be W22, and the line width of the second bias adjustment signal line 43 may be W23. W11+W12+W13>W21+W22+W23, such that, by increasing the line width of at least one of the first reset signal line 31, the first initialization signal line 32 and the first bias adjustment signal line 33, the resistances of the first reset signal line 31, the first initialization signal line 32 and the first bias adjustment signal line 33 in the first display area 100 may be reduced to ensure the display characteristics of the first display area 100. Further, by reducing the line width of at least one of the second reset signal line 41, the second initialization signal line 42 and the second bias adjustment signal line 43, the space occupied by the second reset signal line 41, the second reset signal line 41, the second initialization signal line 42 and the second bias adjustment signal line 43 in the second display area 200 may be reduced to facilitate the setting of the transmission area of the second display area and to ensure the light transmittance of the second display area 200.

Because the display characteristic requirements of the first display area may be higher than the display characteristic requirements of the second display area, based on the above embodiment, in one embodiment of the present disclosure, the line width of at least one of the first reset signal line, the first initialization signal line and the first bias adjustment signal may be larger than the width of the corresponding signal line of the same type in the second display area. For example, the line width of the first reset signal line may be greater than that of the second reset signal, and/or the line width of the first initialization signal line may be greater than the line width of the second initialization signal line, and/or the line width of the first bias adjustment signal line may be greater than that of the second bias adjustment signal line, i.e., W11>W21, and/or W12>W22, and/or W13>W23. By adjusting the line width of at least one of the first reset signal line, the first initialization signal line and the first bias adjustment signal line, the display characteristics of the first display area may be improved. Further, by reducing the line width of at least one of the second reset signal line, the second initialization signal line and the second bias adjustment signal line, the total space occupied by the second reset signal line, the second initialization signal line and the second bias adjustment signal line in the second display area may be reduced. Accordingly, the second display area may have more space to set the transmission area, and the light transmittance of the second display area may be ensured.

Because the first display area may not be provided with a transmission area, it may only be used to realize the display function. The second display area may be provided with a transmission area, on the basis of being used for realizing the display function, the light transmission performance should also be considered. Therefore, in the embodiments of the present disclosure, comparing with each signal line that provides a signal to each pixel circuit of the second display area, the requirements for the resistivity of the line that provides a signal to each pixel circuit of the first display may be higher. It can also be seen from the foregoing descriptions that, among the reset signal line, the initialization signal line, and the bias adjustment signal line, the bias adjustment signal line may have medium requirements for resistivity.

Therefore, in one optional embodiment of the present disclosure, (W11−W21)>(W13−W23)≥(W12−W22), such that the line width of the second reset signal line may be reduced to a first degree, the line width of the second initialization signal line may be reduced to a second degree, and the line width of the second bias adjustment signal line may be reduced to a third degree. The first degree may be greater than the third degree, and the third degree may not be smaller than the second degree to reduce the line width of each signal line in the second display area. Accordingly, based on ensuring the light transmittance of the second display area, and the display characteristics of the second display area may also be taken into account.

Figure 21:
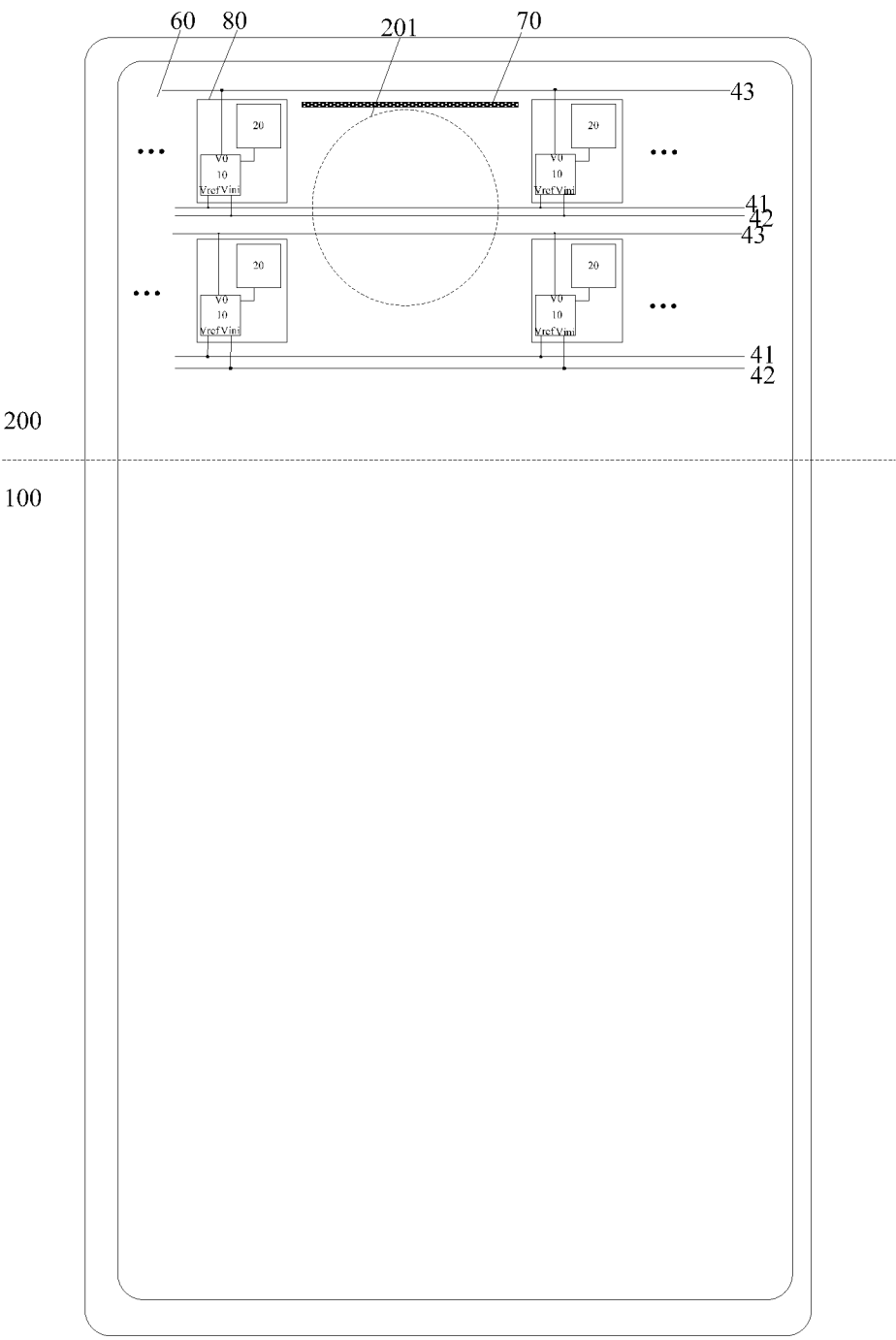
FIG. 21 illustrates a top view of another exemplary display panel according to various disclosed embodiments of the present disclosure.

Based on any of the above embodiments, in one embodiment of the present disclosure, as shown in FIG. 21, the second display area 200 may include pixel islands 60 located between the transmission areas 201 and connection bridges 70 connecting the pixel islands 60. By using the connection bridges 70 to connect the pixel islands 60 located the two sides of the transmission area 201, the pixel islands 60 located on both sides of the transmission area 201 may be controlled by a same signal line. In one embodiment, the pixel islands 60 may include N sub-pixels 80, N≥1, and the pixel islands 60 may include pixel circuits.

Based on the above embodiment, in one embodiment of the present disclosure, as shown in FIG. 21, the second reset signal line 41 may extend along the connection bridge 70 and may be connected with the pixel island 60 to provide a reset signal for the pixel circuit 10 of each sub-pixel 80 included in the pixel island 60. Similarly, the second initialization signal line 42 may extend along the connection bridge 70 and may be connected to the pixel island 60 to provide an initialization signal for the pixel circuit 10 of each sub-pixel 80 included in the pixel island 60. The second bias adjustment signal line 43 may extend along the connection bridge 70 and may be connected to the pixel island

60 to provide a bias adjustment signal to the pixel circuit 10 of each sub-pixel 80 included in the pixel island 60.

Figure 22:
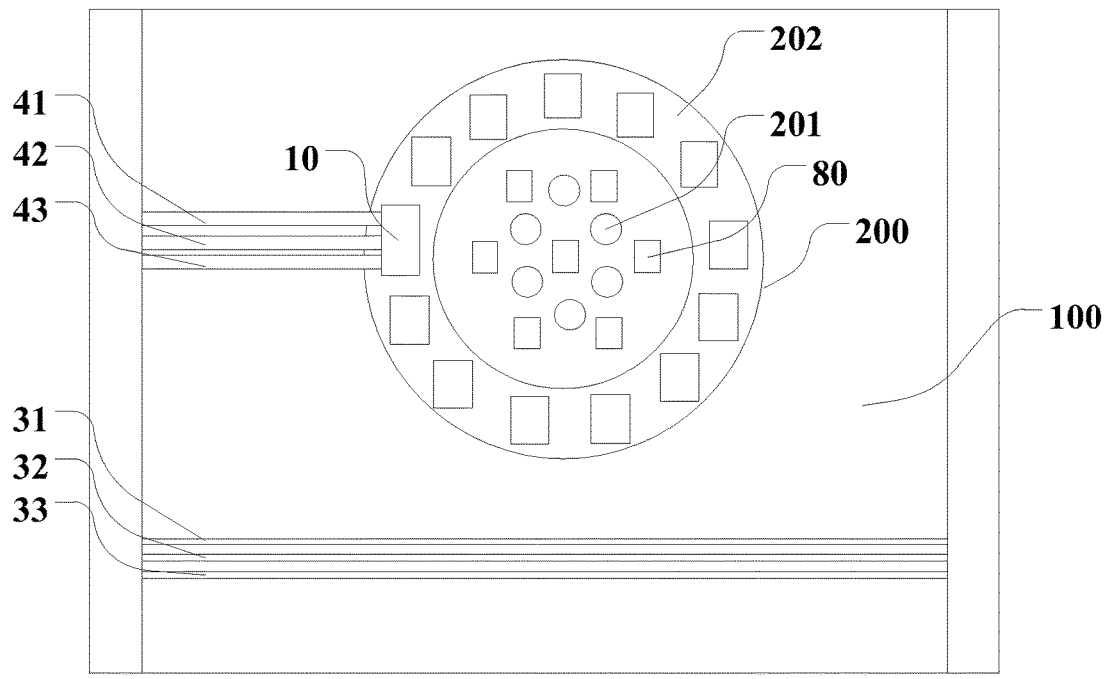
FIG. 22 illustrates a top view of a portion of another exemplary display panel according to various disclosed embodiments of the present disclosure.

FIG. 22 is a top view of a portion of an exemplary display panel provided by another embodiment of the present disclosure. As shown in FIG. 22, the second display area 200 may include a transition area 202, and the transition area 202 may include a pixel circuit 10. The pixel circuit 10 may be configured to provide a signal for the sub-pixel 80 of the second display area 200. The second reset signal line 41, the second initialization signal line 42 and the second bias adjustment signal line 43 may be connected to the pixel circuit 10. In one embodiment, to prevent the pixel circuit 10 from affecting the transmittance of the transmission area, the transition area 202 may be provided, and the pixel circuit 10 may be located in the transition area 202. At this time, the second reset signal line 41, the second initialization signal line 42 and the second bias adjustment signal line 43 may pass through the transition region 202 and may be connected to the pixel circuit 10. In one embodiment, the line width of the first reset signal line 31 may be W11, the line width of the first initialization signal line 32 may be W12, the line width of the first bias adjustment signal line 33 may be W13, the line width of the second reset signal line 41 may be W21, the line width of the second initialization signal line 42 may be W22, and the line width of the second bias adjustment signal line 43 may be W23. Among them, W11+W12+W13<W21+W22+W23. Therefore, the second reset signal line 41, the second initialization signal line 42, and the second bias adjustment signal line 43 may need to be connected to the pixel circuit 10 by passing through the transition region 202. In some cases, wirings may be required, which may lead to the extension of the length of the wiring and the wiring resistance may be increased. To ensure the uniform display effect of the first display area and the second display area and to balance the wiring resistance, it may be necessary to appropriately widen the width of at least one of the second reset signal line 41, the second initialization signal line 42 and the second bias adjusts signal lines 43 such that W11+W12+W13<W21+W22+W23.

In one embodiment, W11<W21, and/or, W12<W22, and/or, W13<W23. By properly widening the line widths of the second reset signal line 41, the second initialization signal line 42 and the second bias adjustment signal line 43, the resistances of the wirings in the first display area and the second display area may be balanced to ensure the display effect of the first display area and the second display area to be uniform.

Further, in one embodiment, W22−W12>W21−W11, and/or W23−W13>W21−W11. As shown above, among the second reset signal line 41, the second initialization signal line 42, and the second bias adjustment signal line 43, the second initialization signal line 42 may have the most stringent resistivity requirements, followed by the second bias adjustment signal line 43 and then the second reset signal line 41. Therefore, in the present disclosure, the increased degree of the width of the second initialization signal line 42 compared to the first initialization signal lines 32 may be greater than the increased degree of the width of the second reset signal line 41 compared with the first reset signal line 31, the increased degree of the width of the second bias adjustment signal line 43 compared with the first bias adjustment signal line 33 may be greater than the increased degree of the width of the second reset signal line 41 compared with the first offset adjustment signal line 41. Further, W22−W12>W23−W13. For example, the increased degree of the width of the second initialization signal line 42 compared with the first initialization signal line 32 may be greater than the increased degree of the second bias adjustment signal line 43 compared with the first bias adjustment signal line 33. Therefore, according to the characteristics of each signal line, the characteristics of each signal line in the first display area and the second display area may be adjusted. Further, the increase of the area occupied by the wirings may be avoided to ensure the display effect.

Figure 23:
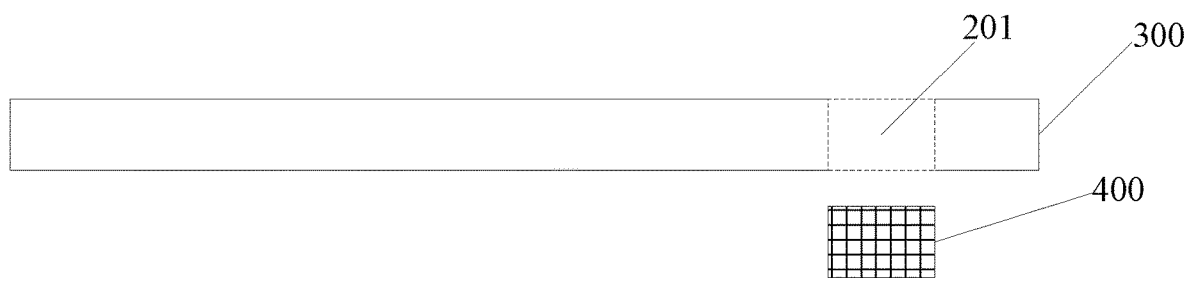
FIG. 23 illustrates an exemplary display device according to various disclosed embodiments of the present disclosure.

Further, the present disclosure provides a display device. The display device may include the display panel provided in any of the above-mentioned embodiments. In one embodiment of the present disclosure, as shown in FIG. 23, the transparent area 201 of the display panel 300 may be correspondingly provided with a functional device 400, and the functional device 400 may receive or reflect light.

In one embodiment of the present disclosure, the functional device may be a camera, but the present disclosure does not limit this. In other embodiments of the present disclosure, the functional device may also be a device including a fingerprint identification device, etc.

In the display panel and the display device provided by the embodiments of the present disclosure, the sum of the resistivity of the first reset signal line, the first initialization signal line and the first bias adjustment signal line disposed in the first display area may not be greater than the sum of the resistivities of the second reset signal line, the second initialization signal line and the second bias adjustment signal line in the second display area such that at least one of the first reset signal line, the first initialization signal line and the first bias adjustment signal line that have relatively high resistivity requirements may be disposed on the layer with a low signal line resistivity to improve the display performance of the first display area. Further, at least one of the second reset signal line, the second initialization signal line, and the second bias adjustment signal line that may have relatively low resistivity requirements in the second display area may be disposed on the layer with a large signal line resistivity to reduce the number of signal lines on the layer with the smaller signal line resistivity and increase the area of the transmission area of the second display area and to ensure the light transmission performance of the second display area. Accordingly, the display performance and the transparency of the display panel may be both taken into account.

Each part in this specification is described in a combination of juxtaposition and progression, and each part focuses on the differences from other parts, and the same and similar parts between each part can be referred to each other.

For the above description of the disclosed embodiments, the features described in each embodiment in this specification can be replaced or combined with each other such that those skilled in the art can realize or use the present disclosure. Various modifications to these embodiments will be readily apparent to those skilled in the art, and the generic principles defined herein may be implemented in other embodiments without departing from the spirit or scope of the present disclosure. Therefore, this disclosure is not intended to be limited to the embodiments shown herein but is to be accorded the widest scope consistent with the principles and novel features disclosed herein.

What is claimed is:
1. A display panel, comprising:
  a plurality of pixel circuits and corresponding light-emitting elements, wherein a pixel circuit includes a driving transistor, and the driving transistor is configured to provide a driving current for the light-emitting element;

a reset signal line, an initialization signal line and a bias adjustment signal line, wherein the reset signal line is configured to provide a reset signal to a gate of the driving transistor, the initialization signal line is configured to provide an initialization signal to the light-emitting element, and the bias adjustment signal line is configured to provide a bias adjustment signal for the driving transistor; and a first display area and a second display area, wherein the second display area includes a transmission area, the first display area includes a first reset signal line, a first initialization signal line and a first bias adjustment signal line that are directly electronically connected to a first pixel circuit, and the second display area includes a second reset signal line, a second initialization signal line and a second bias adjustment signal line that are directly electronically connected to a second pixel circuit, wherein:

a resistivity of the first reset signal line is ρ11, a resistivity of the first initialization signal line is ρ12, a resistivity of the first bias adjustment signal line is ρ13, a resistivity of the second reset signal line is ρ21, a resistivity of the second initialization signal line is ρ22, and a resistivity of the first bias adjustment signal line is ρ23; and

ρ11+ρ12+ρ13≤ρ21+ρ22+ρ23, and wherein:

the first reset signal line and the second reset signal line are disposed in different layers in a direction perpendicular to a surface of the display panel; and/or the first initialization signal line and the second initialization signal line are disposed in different layers in the direction perpendicular to the surface of the display panel; and/or the first bias adjustment signal line and the second bias adjustment signal line are disposed in different layers in the direction perpendicular to the surface of the display panel.

2. The display panel according to claim 1, wherein:
ρ11>ρ12 and/or ρ11>ρ13; and
ρ21>ρ22 and/or ρ21>ρ23.

3. The display panel according to claim 1, wherein:
(ρ23−ρ13)>(ρ22−ρ12) and/or (ρ23−ρ13)>(ρ21−ρ11).

4. The display panel according to claim 1, wherein:
the pixel circuit includes a reset transistor, an initialization transistor and a bias adjustment transistor;
the reset transistor is connected between the reset signal line and the gate of the driving transistor;
the initialization transistor is connected between the initialization signal line and the light-emitting element; and
the bias adjustment transistor is connected between the bias adjustment signal line and a first terminal or a second terminal of the driving transistor.

5. The display panel according to claim 1, wherein:
the pixel circuit includes a reset transistor, an initialization transistor and a compensation transistor;
the reset transistor is connected between the reset signal line and a first terminal or a second terminal of the driving transistor, and the compensation transistor is connected between the gate and a second terminal of the driving transistor; and
the initialization transistor is connected between the initialization signal line and the light-emitting element, wherein an operation process of the pixel circuit includes a bias adjustment stage, and, in the bias adjustment stage, the reset transistor is multiplexed as a bias adjustment transistor, and the reset signal line is multiplexed as the bias adjustment signal line.

6. The display panel according to claim 5, wherein:
ρ11-ρ13 and ρ21=ρ23.

7. The display panel according to claim 1, wherein:
when being orthographically projected to a plane parallel to a surface of the display panel, a distance between the first reset signal line and the first initialization signal line is D11, a distance between the first initialization signal line and the first bias adjustment signal line is D12, and a distance between the first reset signal line and the first bias adjustment signal line is D13;

when being projected to a plane parallel to the surface of the display panel, a distance between the second reset signal line and the second initialization signal line is D21, a distance between the second initialization signal line and the second bias adjustment signal line is D22, and a distance between the second reset signal line and the second bias adjustment signal line is D23; and D11>D21 and/or D12>D22 and/or D13>D23.

8. The display panel according to claim 1, wherein:
in the direction perpendicular to the surface of the display panel, the second reset signal line and the second initialization signal line at least partially overlap; and/or
the second reset signal line and the second bias adjustment signal line at least partially overlap; and/or
the second initialization signal line and the second bias adjustment signal line at least partially overlap.

9. The display panel according to claim 1, wherein:
at least two of the first reset signal line, the first initialization signal line and the first bias adjustment signal line are disposed in a same layer; and
the second reset signal line, the second initialization signal line and the second bias adjustment signal line are all disposed in different layers.

10. The display panel according to claim 9, wherein:
two of the first reset signal line, the first initialization signal line and the first bias adjustment signal line are disposed in a first layer and other of the first reset signal line, the first initialization signal line and the first bias adjustment signal line is disposed in a second layer; and
a resistivity of the first layer is smaller than a resistivity of the second layer.

11. The display panel according to claim 10, wherein:
the first initialization signal line and the first bias adjustment signal line are disposed in the first layer; and
the first reset signal line is disposed in the second layer.

12. The display panel according to claim 10, wherein:
the second reset signal line is disposed in a third layer;
the second initialization signal line is disposed in a fourth layer; and
the second bias adjustment signal line is disposed in a fifth layer,
wherein a resistivity of the fourth layer is smaller than a resistivity of the fifth layer;
and/or the resistivity of the fifth layer is smaller than a resistivity of the third layer.

13. The display panel according to claim 12, wherein:
the fourth layer and the first layer are a same layer; and
the third layer and the second layer are a same layer.

14. The display panel according to claim 1, wherein:
a line width of the first reset signal line is W11;
a line width of the first initialization signal line is W12
a line width of the first bias adjustment signal line is W13;
a line width of the second reset signal line is W21;

a line width of the second initialization signal line is W22;
a line width of the second bias adjustment signal line is W23; and
W11+W12+W13>W21+W22+W23.

15. The display panel according to claim 14, wherein:
(W11−W21)>(W13−W23)≥(W12−W22).

16. The display panel according to claim 1, wherein:
the second display area includes a transition area;
the transition area includes a pixel circuit;
the pixel circuit is configured to provide signals for sub-pixels of the second display area; and
the second reset signal line, the second initialization signal line, and the second bias adjustment signal line are connected to the pixel circuit of the transition area.

17. The display panel according to claim 16, wherein:
a line width of the first reset signal line is W11;
a line width of the first initialization signal line is W12;
a line width of the first bias adjustment signal line is W13;
a line width of the second reset signal line is W21;
a line width of the second initialization signal line is W22;
a line width of the second bias adjustment signal line is W23; and
(W11+W12+W13)<(W21+W22+W23).

18. The display panel according to claim 17, wherein:
(W22−W12)>(W21−W11) and/or (W23−W13)>(W21−W11).

19. A display device, comprising:
a display panel, including:
a plurality of pixel circuits and corresponding light-emitting elements, wherein a pixel circuit includes a driving transistor, and the driving transistor is configured to provide a driving current for the light-emitting element;
a reset signal line, an initialization signal line and a bias adjustment signal line, wherein the reset signal line is configured to provide a reset signal to a gate of the driving transistor, the initialization signal line is configured to provide an initialization signal to the light-emitting element, and the bias adjustment signal line is configured to provide a bias adjustment signal for the driving transistor; and
a first display area and a second display area, wherein the second display area includes a transmission area, the first display area includes a first reset signal line, a first initialization signal line and a first bias adjustment a signal line that are directly electronically connected to a first pixel circuit, and the second display area includes a second reset signal line, a second initialization signal line and a second bias adjustment signal line that are directly electronically connected to a second pixel circuit,
wherein:
a resistivity of the first reset signal line is ρ11, a resistivity of the first initialization signal line is ρ12, a resistivity of the first bias adjustment signal line is ρ13, a resistivity of the second reset signal line is ρ21, a resistivity of the second initialization signal line is ρ22, and a resistivity of the first bias adjustment signal line is ρ23;
ρ11+ρ12+ρ13≤ρ21+ρ22+ρ23;
a functional device is correspondingly disposed in the transmission area; and
the functional device receives or reflects light through the transmission area,
and wherein:
the first reset signal line and the second reset signal line are disposed in different layers in a direction perpendicular to a surface of the display panel; and/or
the first initialization signal line and the second initialization signal line are disposed in different layers in the direction perpendicular to the surface of the display panel; and/or
the first bias adjustment signal line and the second bias adjustment signal line are disposed in different layers in the direction perpendicular to the surface of the display panel.

* * * * *